(12) United States Patent
Kang et al.

(10) Patent No.: US 11,355,489 B2
(45) Date of Patent: Jun. 7, 2022

(54) SEMICONDUCTOR DEVICE INCLUDING STANDARD CELL

(71) Applicant: Samsung Electronics Co., Ltd., Suwon-si (KR)

(72) Inventors: Byounggon Kang, Seoul (KR); Subin Jin, Jeonju-si (KR); Ha-Young Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 84 days.

(21) Appl. No.: 17/009,941

(22) Filed: Sep. 2, 2020

(65) Prior Publication Data

US 2021/0210479 A1 Jul. 8, 2021

(30) Foreign Application Priority Data

Jan. 3, 2020 (KR) .................. 10-2020-0000960

(51) Int. Cl.
*H01L 27/02* (2006.01)
*H03K 3/3562* (2006.01)
*H03K 3/037* (2006.01)
*H01L 27/118* (2006.01)

(52) U.S. Cl.
CPC ....... *H01L 27/0207* (2013.01); *H03K 3/0372* (2013.01); *H03K 3/35625* (2013.01); *H01L 2027/11881* (2013.01)

(58) Field of Classification Search
CPC .............. H01L 27/0207; H03K 3/0372; H03K 3/35625
See application file for complete search history.

(56) References Cited

U.S. PATENT DOCUMENTS

| 8,274,319 | B2 | 9/2012 | Maeno |
| 8,513,999 | B2 | 8/2013 | Uemura |
| 8,723,574 | B2 | 5/2014 | Tomita |
| 9,641,161 | B1 | 5/2017 | Liu et al. |
| 9,753,086 | B2 | 9/2017 | Kim et al. |
| 2018/0108646 | A1 | 4/2018 | Lee et al. |

FOREIGN PATENT DOCUMENTS

JP H05312919 A 11/1993

*Primary Examiner* — Patrick O Neill
(74) *Attorney, Agent, or Firm* — Harness, Dickey & Pierce, P.L.C.

(57) ABSTRACT

A semiconductor device includes a standard cell, which includes first to fourth active areas that are extended in a first direction, first to fourth gate lines that are extended in a second direction perpendicular to the first direction over the first to fourth active areas and are disposed parallel to each other, a first cutting layer that is disposed between the first active area and the second active area and separates the second and third gate lines, a second cutting layer that is disposed between the third active area and the fourth active area and separates the second and third gate lines, a first gate contact that is formed on the second gate line separated by the first cutting layer and the second cutting layer, and a second gate contact that is formed on the third gate line separated by the first cutting layer and the second cutting layer.

20 Claims, 16 Drawing Sheets

SEMICONDUCTOR DEVICE INCLUDING STANDARD CELL

CROSS-REFERENCE TO RELATED APPLICATIONS

This application claims priority under 35 U.S.C. § 119 to Korean Patent Application No. 10-2020-0000960 filed on Jan. 3, 2020, in the Korean Intellectual Property Office, the disclosure of which is incorporated by reference herein in its entirety.

BACKGROUND

Some example embodiments of inventive concepts described herein relate to a semiconductor device, and more particularly, relate to a semiconductor device including a standard cell capable of operating at high speed.

As semiconductor process technologies develop, an integrated circuit is being scaled down at a high rate. In general, the performance of transistors included in a standard cell may vary depending on, for example, the lay out of the transistors. In particular, the arrangement or locations of contacts may have an influence on a data transfer speed in the standard cell and/or the reliability of the standard cell.

With the nano-scale manufacturing technology, there are attempts to improve the data transfer speed and/or the reliability by adjusting locations of contacts and/or changing the layout structure of the standard cell.

SUMMARY

Example of inventive concepts provide a layout structure of a standard cell capable of adjusting a contact location and/or reducing the number of contacts, and/or an integrated circuit and a semiconductor device including the same.

According to some example embodiments, a semiconductor device includes a standard cell. The standard cell includes first to fourth active areas extending in a first direction, first to fourth gate lines over the first to fourth active areas and parallel to each other, the first to fourth gate lines extending in a second direction perpendicular to the first direction, a first cutting layer between the first active area and the second active area and cutting the second and third gate lines, a second cutting layer between the third active area and the fourth active area and cutting the second and third gate lines, a first gate contact on the second gate line, the first gate contact between the first cutting layer and the second cutting layer, and a second gate contact on the third gate line, the second gate contact between the first cutting layer and the second cutting layer.

According to some example embodiments, a semiconductor device includes first and second gate lines extended in a first direction and parallel to each other, a first cutting layer extending in a second direction perpendicular to the first direction, the first cutting layer cutting the first and second gate lines, a second cutting layer cutting the first and second gate lines on one side below the first cutting layer with respect to the first direction, a first gate contact on the first gate line, the first gate contact between the first cutting layer and the second cutting layer, and a second gate contact on the second gate line, the second gate contact between the first cutting layer and the second cutting layer. Gates of first and second NMOS transistors associated with a data path of the master latch and a feedback path of the slave latch correspond to the first gate line placed between the first cutting layer and the second cutting layer, and gates of third and fourth NMOS transistors associated with a feedback path of the master latch and a data path of the slave latch correspond to the second gate line placed between the first cutting layer and the second cutting layer.

BRIEF DESCRIPTION OF THE FIGURES

The above and other objects and features of inventive concepts will become apparent by describing in detail some example embodiments thereof with reference to the accompanying drawings.

DETAILED DESCRIPTION

Below, example embodiments of inventive concepts may be described in detail and clearly to such an extent that a person of ordinary skill in the art may implement inventive concepts.

Figure 1:
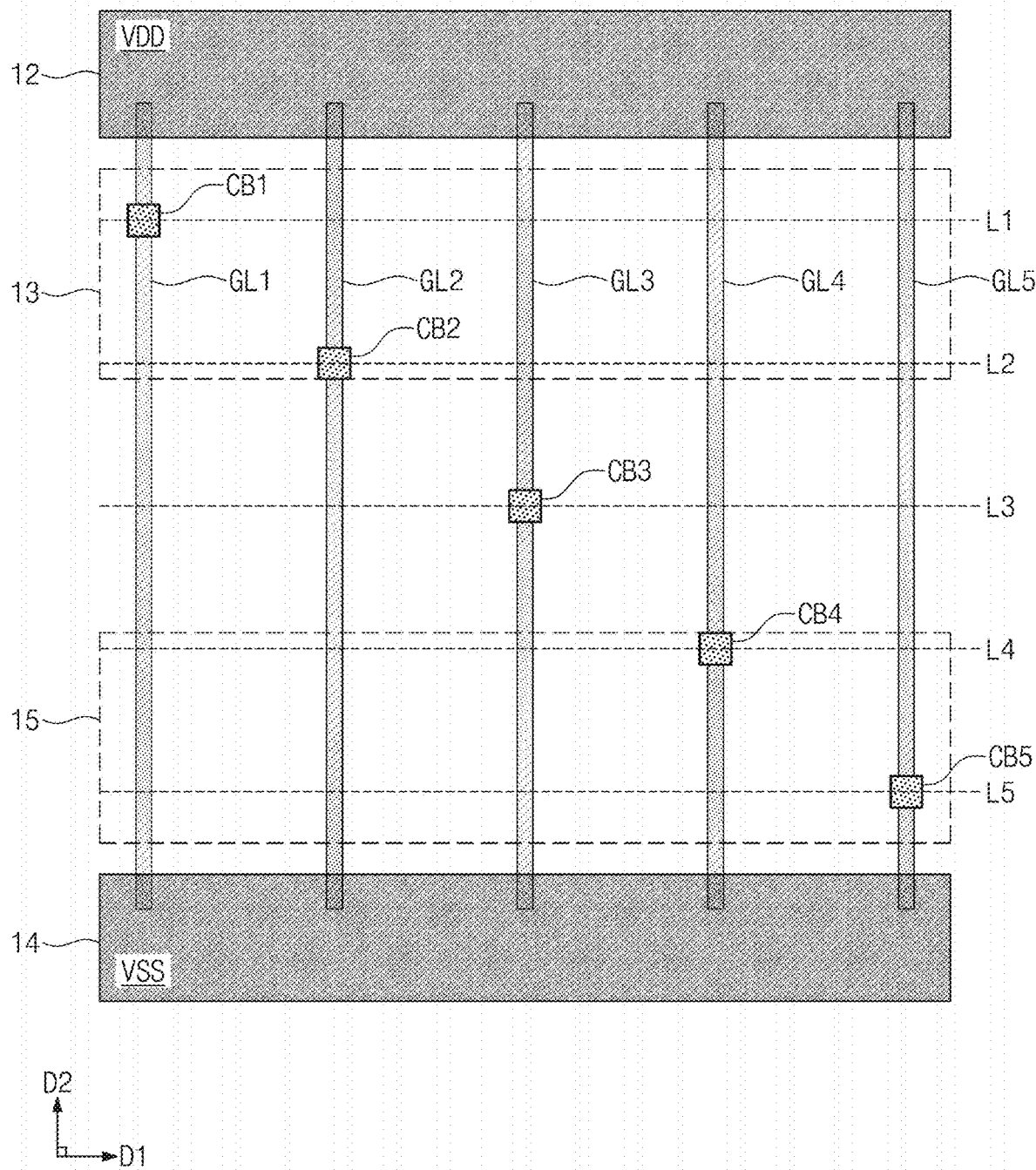
FIG. 1 illustrates a layout of a semiconductor device for describing locations of gate contacts in a standard cell.

FIG. 1 illustrates a layout of a semiconductor device that describes locations of gate contacts included in a standard cell. Referring to FIG. 1, a standard cell 10 may include a plurality of gate contacts CB1-CB5 that are formed at a plurality of locations L1-L5 in a first direction D1 and a second direction D2 through a process of the specific degree of integration.

The standard cell 10 includes a plurality of gate lines, e.g. gate lines GL1 to GL5 each extending in the second direction D2. Active areas 13 and 15 are respectively formed on an upper side and a lower side of the gate lines GL1 to GL5 in the second direction D2, and the gate lines GL1 to GL5 may be included in one cell row. A PMOS transistor may be formed at a side, e.g. side 11, of a first power supply voltage VDD, and an NMOS transistor may be formed at a side, e.g. side 15, of a second power supply voltage VSS. Accordingly, as a PMOS transistor and an NMOS transistor may be formed along gate lines. For example, one gate line GL1, the PMOS and NMOS transistors may share the gate line GL1 to constitute/correspond to components of a complementary metal-oxide semiconductor (CMOS) type inverter. To this end, gate contacts CB1 to CB5 for transferring driving signals from metal layers (not illustrated) to the gate electrodes of the transistors, e.g. gate line GL1, may be formed.

A gate contact may be formed at least one of locations L1 to L5 of the gate lines GL1 to GL5 in the second direction D2. The locations L1 to L5 may correspond to locations of metal lines formed at a first metal layer (not illustrated) so as to extend in a first direction D1. In a case where the gate lines GL1 to GL5 are formed for respective inverters, the performance of each of the inverters may vary depending on a location of a gate contact CBi (i=1, 2, 3, 4, or 5). For example, the performance of (e.g. speed of) inverters having the gate contacts CB1 and CB2 formed at the locations L1 and L2 may be better than the performance of inverters having the gate contacts CB4 and CB5 formed at the locations L4 and L5. Although not illustrated, as a location of a gate contact CB becomes closer to an NMOS transistor of an inverter, a speed of the inverter may become slower. In contrast, as the location of the gate contact CB becomes closer to a PMOS transistor of the inverter, a speed of the inverter may become higher.

Before the nano-scale manufacturing technology is used, because a location of the gate contact CB is fixed, controlling the performance of an inverter or a transistor through a location where the gate contact CB is formed may not be efficient. As the nano-scale manufacturing technology is used, the degree of freedom in which a location of the gate contact CB is selected in one cell row may increase. Inventive concepts are directed to provide a technology for improving the performance of a standard cell associated with a flip-flop and/or various logic circuits by using the above characteristics.

Figure 2:
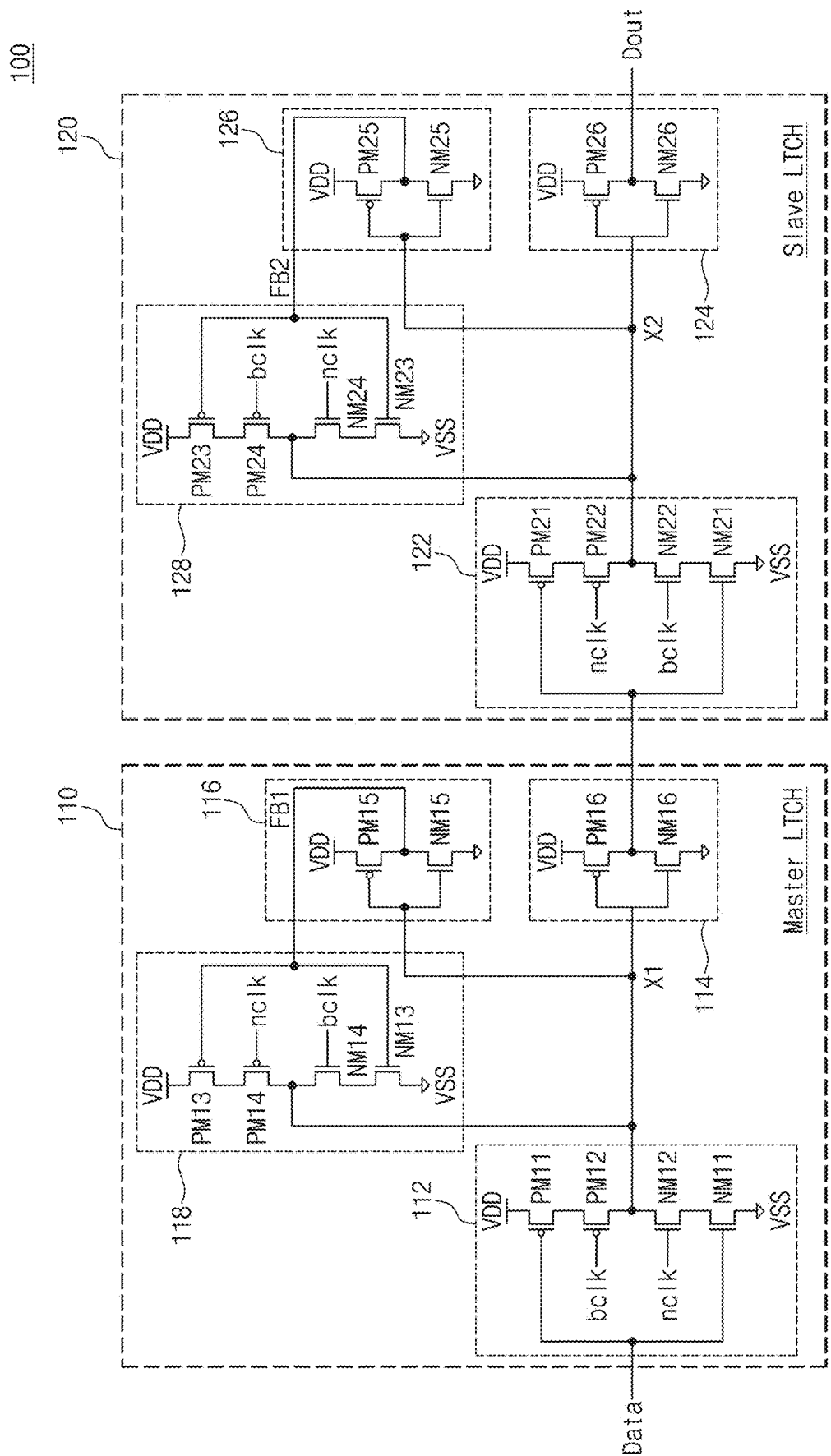
FIG. 2 is a circuit diagram illustrating a flip-flop according to an embodiment of inventive concepts.

FIG. 2 is a circuit diagram illustrating a flip-flop according to an embodiment of inventive concepts. Referring to FIG. 2, a flip-flop 100 includes a master latch 110 and a slave latch 120.

The master latch 110 may include a first tri-state inverter 112, a second tri-state inverter 118, and inverters 114 and 116. The slave latch 120 may include a third tri-state inverter 122, a fourth tri-state inverter 128, and inverters 124 and 126.

The master latch 110 may receive data "Data", which is input to the flip-flop 100, through the first tri-state inverter 112. In response to the input data "Data", a PMOS transistor PM11 of the first tri-state inverter 112 may be pulled up, and an NMOS transistor NM11 of the first tri-state inverter 112 may be pulled down. However, an output of the first tri-state inverter 112 may be transferred to a node X1 only when both a PMOS transistor PM12 and an NMOS transistor NM12 respectively responding to clock signals bclk and nclk are turned on.

The first inverter 114 including a PMOS transistor PM16 and an NMOS transistor NM16 may invert data at the node X1 and may transfer the inverted data to the slave latch 120. The second inverter 116 including a PMOS transistor PM15 and an NMOS transistor NM15 may invert the data set up at the node X1 and may transfer the inverted data to a first feedback node FB1. The first feedback node FB1 corresponds to a common gate of a PMOS transistor PM13 and an NMOS transistor NM13 of the second tri-state inverter 118.

The second tri-state inverter 118 forms a feedback path of the master latch 110. The second tri-state inverter 118 performs a pull-up and/or pull-down operation in response to data transferred from the second inverter 116. The PMOS transistor PM13 pulls up, and the NMOS transistor NM13 pulls down the node X1 in response to an output of the second inverter 116. In particular, the second tri-state inverter 118 includes a PMOS transistor PM14 and an NMOS transistor NM14 respectively responding to the complementary clock signals nclk and bclk. However, unlike the first tri-state inverter 112, the clock signal bclk is input to a gate of the NMOS transistor NM14, and the clock signal nclk is input to a gate of the PMOS transistor PM14.

The slave latch 120 inverts data Y1 provided to the third tri-state inverter 122, and transfers the inverted data to a node X2. A PMOS transistor PM21 performs a pull-up, and an NMOS transistor performs a pull-down operation, in response to the data input to the third tri-state inverter 122. The node X2 corresponding to an output terminal of the third tri-state inverter 122 may be pulled down or pulled up only when both a PMOS transistor PM22 and an NMOS transistor NM22 respectively responding to the complementary clock signals nclk and bclk are turned on. The third inverter 124 composed of a PMOS transistor PM26 and an NMOS transistor NM26 inverts the data set up at the node X2 and transfers the inverted data as output data Dout. The fourth inverter 126 composed of a PMOS transistor PM25 and an NMOS transistor NM25 pulls up or pulls down a second feedback node FB2 in response to the data set up at the node X2. For example, the fourth inverter 126 inverts the data set up at the node X2 and transfers the inverted data to the fourth tri-state inverter 128.

The fourth tri-state inverter 128 forms a feedback path of the slave latch 120. The fourth tri-state inverter 128 performs a pull-up or a pull-down operation in response to data transferred from the fourth inverter 126. A PMOS transistor PM23 performs a pull up, and an NMOS transistor NM23 performs a pulls down, of the node X2 in response to an output of the fourth inverter 126. In particular, the fourth tri-state inverter 128 includes a PMOS transistor PM24 and an NMOS transistor NM24 respectively responding to the complementary clock signals bclk and nclk. However, unlike the third tri-state inverter 122, the clock signal bclk is input to a gate of the PMOS transistor PM24, and the clock signal nclk is transferred to a gate of the NMOS transistor NM24.

According to the circuit configuration of the flip-flop 100 described above, the clock signals bclk and nclk that are provided to the tri-state inverters 112, 118, 122, and 128 may be mutually synchronized and input. However, due to a structure of the layout, there may be a problem in synchronization of clocks signals that are provided to the first tri-state inverter 112 and the second tri-state inverter 118. For example, there may be a problem in data reliability of the master latch 110 due to operating characteristics of the NMOS transistor NM12 of the first tri-state inverter 112 and the PMOS transistor PM14 of the second tri-state inverter 118, which are driven by the clock nclk. This phenomenon may occur identically in the slave latch 120.

In the layout structure of the standard cell of the flip-flop 100 according to inventive concepts, the above issue may be solved, or reduced in likelihood of occurrence, by adjusting the number of gate contacts CB and/or locations of the gate contacts CB. For example, according to a double height structure DHS, the NMOS transistor NM12 included in the first tri-state inverter 112 of the master latch 110 and the NMOS transistor NM24 included in the fourth tri-state inverter 128 of the slave latch 120 may share a gate electrode. A speed and/or a reliability in operation may be improved by transferring the clock signal nclk to the shared gate electrode by using one gate contact CB.

Alternatively or additionally, according to the double height structure DHS, the NMOS transistor NM14 included in the second tri-state inverter 118 of the master latch 110 and the NMOS transistor NM22 included in the third tri-state inverter 122 of the slave latch 120 may share a gate electrode. A speed and/or a reliability in operation may be improved by transferring the clock signal bclk to the shared gate electrode by using one gate contact CB. This will be described in detail with reference to drawings to be described below.

Figure 3:
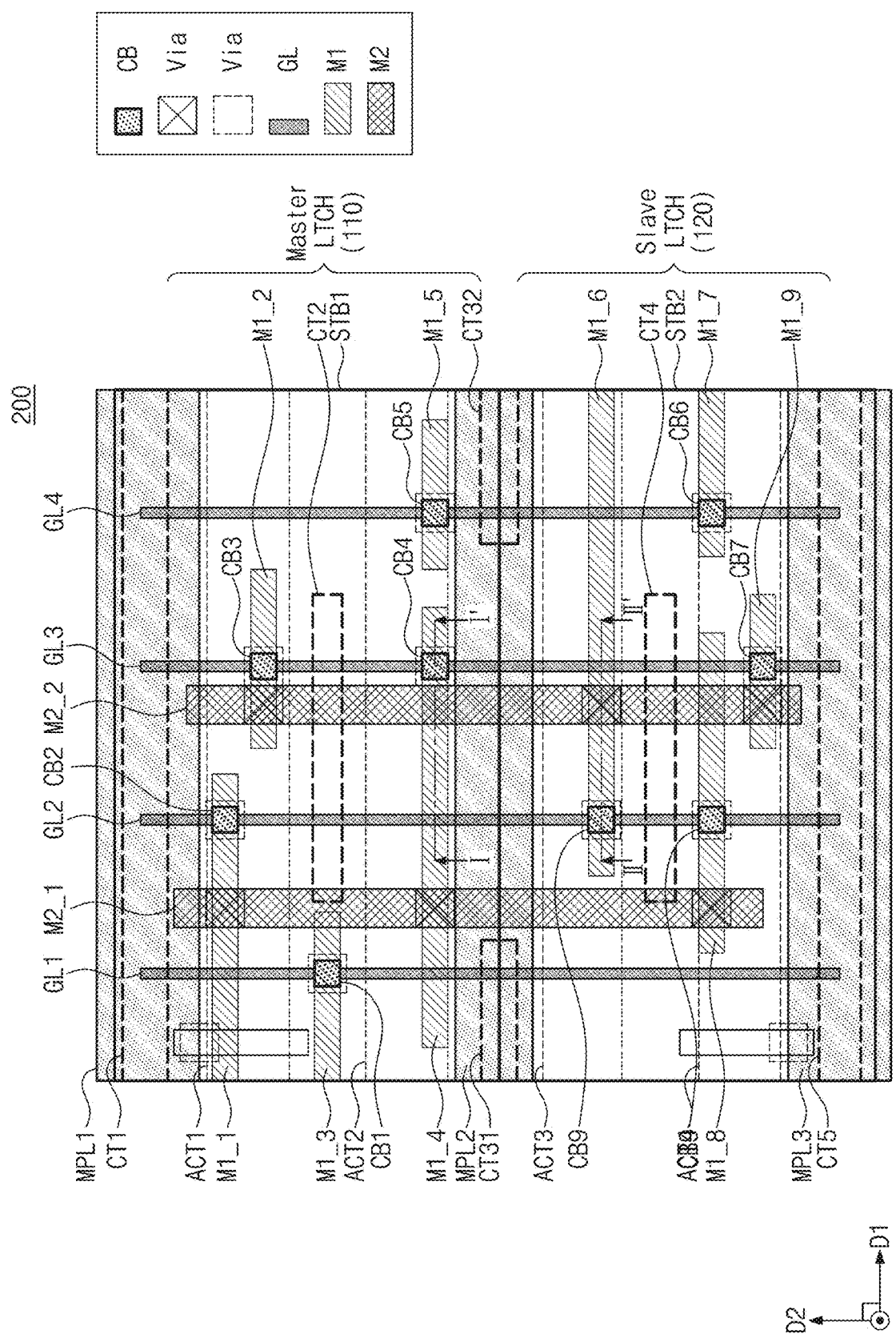
FIG. 3 is a view illustrating a standard cell layout structure of a flip-flop according to an embodiment of inventive concepts.

FIG. 3 is a view illustrating a standard cell layout structure of a flip-flop according to an embodiment of inventive concepts. Referring to FIG. 3, a standard cell 200 of inventive concepts may be implemented by a layout using the double height structure DHS and contact poly pitch (2CPP) cutting layers CT. The double height structure DHS may be a structure in which two cell rows are included in one standard cell, and a rail for any one of the power supply voltages VDD or VSS (e.g. a low voltage or ground rail) may be shared in two cell rows. To implement this, gate lines may be routed by using the 2CPP cutting layer CT.

The standard cell 200 may include first to fourth active areas ACT1, ACT2, ACT3, and ACT4, first to fourth gate lines GL1 to GL4, a plurality of gate contacts CB1 to CB9, cutting layers CT1, CT2, CT31, CT32, CT4, and CT5, and power rails MPL1, MPL2, and MPL3. The standard cell 200 according to the present embodiment has a cross couple structure for providing the clock signals nclk and bclk. Here, for convenience of description of inventive concepts, only a portion of the standard cell 200 is illustrated, but the standard cell 200 may be designed to further include any other components (or elements).

The first to fourth active areas ACT1 to ACT4 may extend along the first direction D1 and may be disposed parallel to each other in the second direction D2 substantially perpendicular to the first direction D1. In some example embodiments, the first active area ACT1 and the second active area ACT2 may be disposed to be spaced from each other in the second direction D2. The power rail MPL2 for providing the ground voltage VSS may be placed between the second active area ACT2 and the third active area ACT3. In addition, the third active area ACT3 and the fourth active area ACT4 may be disposed to be spaced from each other in the second direction D2. According to some example embodiments, the first to fourth active areas ACT1 to ACT4 may correspond to portions of a substrate that include, e.g. are doped with, impurities.

The first to fourth gate lines GL1, GL2, GL3, and GL4 may extend along the second direction D2 over the first to fourth active areas ACT1 to ACT4 and may be disposed parallel to each other in the first direction D1. Accordingly, the first to fourth gate lines GL1, GL2, GL3, and GL4 may be formed of a material having electrical conductivity and may include, for example, at least one of polysilicon, metal, metal alloy, etc. In some example embodiments, the first to fourth gate lines GL1, GL2, GL3, and GL4 may correspond to gate electrodes and/or gate structures. However, inventive concepts are not limited thereto. For example, the first to fourth gate lines GL1, GL2, GL3, and GL4 may be traces having conductivity.

The cutting layers CT1, CT2, CT31, CT32, CT4, and CT5 may be formed to cross at least one of the first to fourth gate lines GL1, GL2, GL3, and GL4. The cutting layer CT1 is a marking layer for cutting upper portions of the first to fourth gate lines GL1, GL2, GL3, and GL4, and may extend in the first direct D1 along the length of the first active area ACT1. The cutting layer CT5 is a marking layer for cutting lower portions of the first to fourth gate lines GL1, GL2, GL3, and GL4, and may extend in the first direction D1 along the length of a lower active layer.

The cutting layer CT2 may extend in the first direction D1 between the first active area ACT1 and the second active area ACT2 and may be disposed to cross the second and third gate lines GL2 and GL3. The cutting layer CT2 may be a layer for cutting some, e.g., two, of the gate lines in the first direction D1. The cutting layer CT2 may be a cutting layer for cutting two gate line pitches 2CPP, and this structure is called a "2CPP cutting layer 2CPP CT". According to the cutting layer CT2, the second and third gate lines GL2 and GL3 above the first active area ACT1 and the second active area ACT2 may be electrically separated.

The cutting layer CT4 may extend in the first direction D1 between the third active area ACT3 and the fourth active area ACT4 and may be disposed to cross the second and third gate lines GL2 and GL3 Like the cutting layer CT2, the cutting layer CT4 may be implemented by the 2CPP cutting layer 2CPP CT. According to the cutting layer CT4, the second and third gate lines GL2 and GL3 above the third active area ACT3 and the fourth active area ACT4 may be electrically separated.

Each of the cutting layers CT31 and CT32 is a marking layer for cutting each of the first and fourth gate lines GL1 and GL4 into two portions. The first gate line GL1 is divided into a portion of the master latch 110 (refer to FIG. 2) and a portion of the slave latch 120 by the cutting layer CT31. The fourth gate line GL4 is divided into a portion of the master latch 110 and a portion of the slave latch 120 by the cutting layer CT32.

The plurality of gate contacts CB1 to CB9 are provided to transfer gate signals of transistors constituting/corresponding to the flip-flop 100. The gate contact CB1 transfers the data "Data" to the gates of the PMOS transistor PM11 and the NMOS transistor NM11 of the first tri-state inverter 112 of FIG. 2. A via and a metal line M1_3 for transferring the data "Data" to the gate contact CB1 may be respectively formed above the gate contact CB1.

Here, a first metal layer extending in the first direction D1 may include five metal lines M1_1 to M1_5 spaced from each other in the second direction D2 at the same interval and interposed between the power rails MPL1 and MPL2. For example, two metal lines may be formed above the first active area ACT1, and two metal lines may be formed above the second active area ACT2. One metal line may be formed at the first metal layer M1 between the first active area ACT1 and the second active area ACT2.

In addition, the first metal layer including metal lines M1_1-M1_5 extending in the first direction D1 may further include five metal lines spaced from each other in the second direction D2 at the same interval and interposed between the power rails MPL2 and MPL3. For example, two metal lines may be formed above the third active area ACT3, and two metal lines may be formed above the fourth active area ACT4. One metal line may be formed at the first metal layer M1 between the third active area ACT3 and the fourth active area ACT4. Locations of the plurality of gate contacts CB1 to CB9 may correspond to intersections of the gate lines GL1 to GL4 and the metal lines formed at the first metal layer M1. However, it may be understood that the number of metal lines formed at the first metal layer M1 and the size of the metal lines are not limited to the example illustrated in FIG. 3.

The gate contact CB2 is formed to provide the clock signal bclk (hereinafter referred to as "B") to the gate electrode of, e.g. corresponding to, the PMOS transistor PM12 included in the master latch 110. The gate line GL2 is cut between the first active area ACT1 and the second active area ACT2 by the cutting layer CT2 so as to be electrically separated into two portions. The first active area ACT1 and the portion of the gate line GL2 above the cutting layer CT2 may form/correspond to the PMOS transistor PM12. The clock signal "B" is provided to the gate electrode of the PMOS transistor PM12 through the gate contact CB2. Additionally, the gate contact CB2 may be provided with the clock signal "B" through a metal line M1_1 and the via. The clock signal "B" may be provided through a metal line M2_1 and may be distributed into the gate contacts CB2, CB4, and CB8.

The gate contact CB3 is formed to provide the clock signal nclk (hereinafter referred to as "N") to the gate electrode of/corresponding to the PMOS transistor PM14 included in the master latch 110. The gate line GL3 is cut between the first active area ACT1 and the second active area ACT2 by the cutting layer CT2 so as to be electrically separated into two portions. The first active area ACT1 and the portion of the gate line GL3 above the cutting layer CT2 and may form/correspond to the PMOS transistor PM14. The clock signal "N" is provided to the gate electrode of the PMOS transistor PM14 through the gate contact CB3. Metal lines M2_2 and M1_2 and vias may be used to transfer the clock signal "N" to the gate contact CB3. The clock signal "N" may be provided through the metal line M2_2 and may be distributed into the gate contacts CB3, CB7, and CB9. For example, the clock signal "N" that is transferred through the metal line M2_2 may be transferred to the metal line M1_2 through a via and may be transferred to the gate line GL3 through the gate contact CB3.

The gate contact CB4 is formed to provide the clock signal "B" to the gate electrode of/corresponding to the NMOS transistor NM14 included in the master latch 110. The gate line GL3 is cut between the first active area ACT1 and the second active area ACT2 by the cutting layer CT2 so as to be electrically separated into two portions. The second active area ACT2 and the portion of the gate line GL3 below the cutting layer CT2 may form/correspond to the NMOS transistor NM14. The clock signal "B" is provided to the gate electrode of the NMOS transistor NM14 through the gate contact CB4. The clock signal "B" that is transferred through the metal line M2_1 may be transferred to a metal line M1_4 through a via and may be transferred to the portion of the gate line GL3 below the cutting layer CT2 through the gate contact CB4. The metal lines M1_4 and M2_1 and vias and a structure of the gate contact CB4 will be more fully described with reference to FIG. 4A below.

The gate contact CB5 is formed to transfer a first feedback data FB1 to the common gate of/corresponding to the PMOS transistor PM13 and the NMOS transistor NM13 included in the second tri-state inverter 118 of the master latch 110. The gate line GL4 is divided into a master latch portion and a slave latch portion by the cutting layer CT32. The first feedback data FB1 may be provided to the master latch portion of the gate line GL4. The first feedback data FB1 fed back through the inverter 116 is transferred through a metal line M1_5. The first feedback data FB1 is transferred to the master latch portion of the gate line GL4 through a via and the gate contact CB5. Here, the layout of the inverter 116 for providing the first feedback data FB1 is omitted, e.g. omitted for brevity.

The gate contact CB6 for the slave latch 120 provides output data Y1 of the master latch 110 to the gate electrodes of/corresponding to the PMOS transistor PM21 and the NMOS transistor NM21 of the third tri-state inverter 122 of FIG. 2. A metal line M1_7 is used to transfer the output data Y1 to the gate contact CB6. The metal line M1_7 and the gate contact CB6 may be connected through a via.

The gate contact CB7 is formed to provide the clock signal "N" to the gate electrode of/corresponding to the PMOS transistor PM22 included in the slave latch 120. The gate line GL3 is cut between the third active area ACT3 and the fourth active area ACT4 by the cutting layer CT4 so as to be electrically separated into two portions. The fourth active area ACT4 and the portion of the gate line GL3 below the cutting layer CT4 may form/correspond to the PMOS transistor PM22. The clock signal "N" is provided to the metal line M2_2 and is transferred to a metal line M1_9 through at least one via. The metal line M1_9 is connected with the gate electrode of the PMOS transistor PM22 through a via and the gate contact CB7.

The gate contact CB8 is formed to provide the clock signal "B" to the gate electrode of/corresponding to the PMOS transistor PM24 included in the slave latch 120. The gate line GL2 is cut between the third active area ACT3 and the fourth active area ACT4 by the cutting layer CT4 so as to be electrically separated into two portions. The fourth active area ACT4 and the portion of the gate line GL2 below the cutting layer CT4 may form/correspond to the PMOS transistor PM24. The clock signal "B" that is transferred through the metal line M2_1 may be transferred to a metal line M1_8 through a via and may be transferred to the portion of the gate line GL2 below the cutting layer CT2 through the gate contact CB8. The clock signal "B" transferred to the gate contact CB8 through the metal line M1_8 and a via may be transferred to the gate electrode of the PMOS transistor PM24.

The gate contact CB9 is formed to provide the clock signal "N" to the gate electrode of/corresponding to the NMOS transistor NM24 included in the slave latch 120. The gate line GL2 is cut between the third active area ACT3 and the fourth active area ACT4 by the cutting layer CT4 so as to be electrically separated into two portions. The third active area ACT3 and the portion of the gate line GL2 above the cutting layer CT4 may form/correspond to the NMOS transistor NM24. The clock signal "N" is provided to the metal line M2_2 and is transferred to a metal line M1_6 through at least one via. The metal line M1_6 may provide the clock signal "N" to the gate electrode of/corresponding to the NMOS transistor NM24 through a via and the gate contact CB9.

As described above, according to the standard cell layout of the flip-flop of inventive concepts, the number of gate contacts CBi for NMOS transistors included in the master latch 110 and the slave latch 120 may decrease by using the dual height structure. Alternatively or additionally, because a location of a gate contact for an NMOS transistor is adjustable, the performance of the flip-flop 100 may be prevented, or reduced in likelihood, from being reduced due to the number of gate contacts or locations thereof.

Figure 4A:
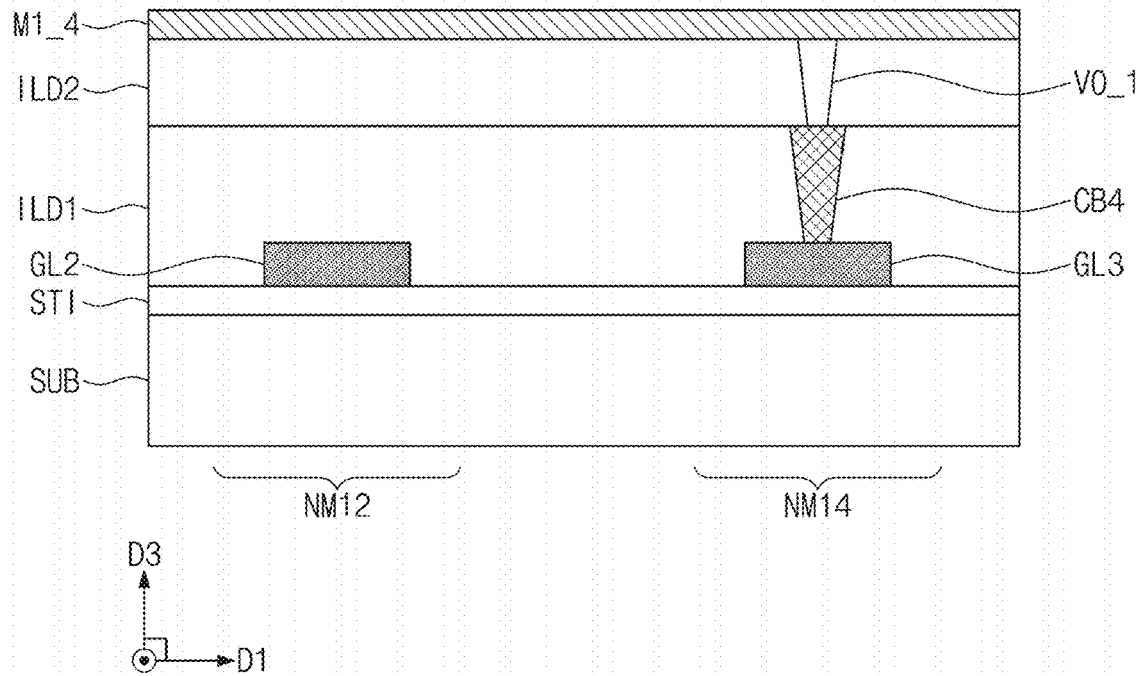
FIGS. 4A and 4B are cross-sectional views of a standard cell taken along line I-I' and line II-II' of FIG. 3.
Figure 4B:
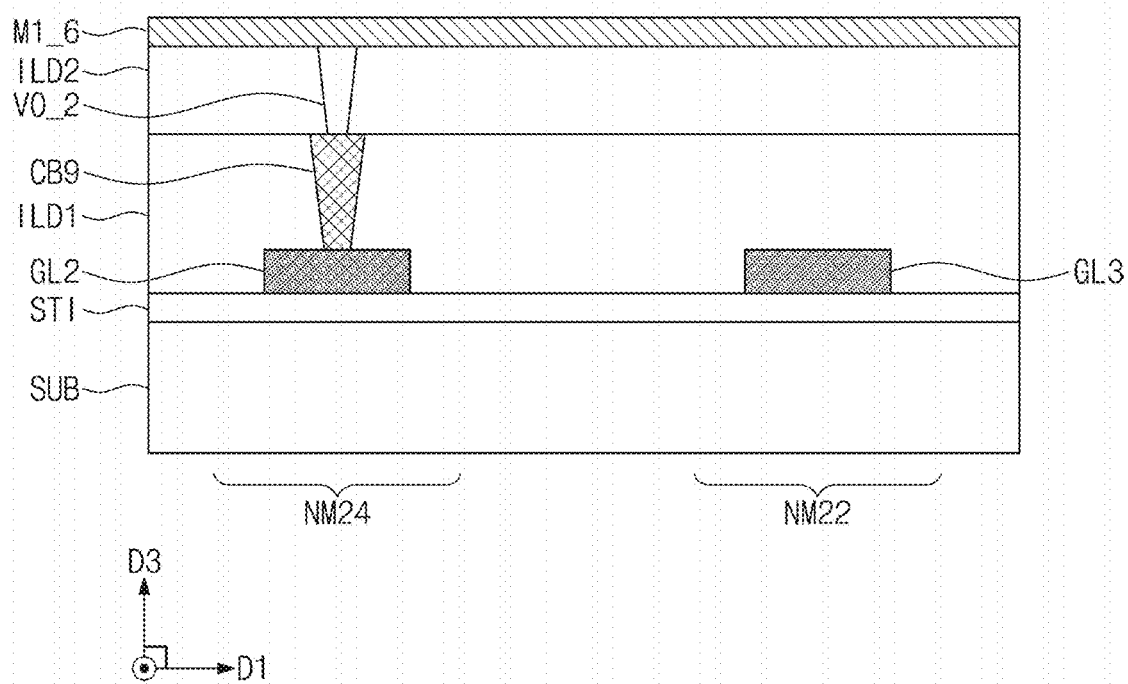

FIGS. 4A and 4B are cross-sectional views of a standard cell taken along line I-I' and line II-II' of FIG. 3.

FIG. 4A shows cross sections of the NMOS transistors NM12 and NM14 of the master latch 110, taken along line I-I'. The substrate may be or may include a semiconductor substrate. For example, the semiconductor substrate may include one of silicon, silicon-on-insulator, silicon-on-sapphire, germanium, silicon-germanium, or gallium-arsenic, and may be doped, e.g. lightly doped, with impurities such as boron. A device isolation layer STI may be disposed on the substrate SUB, and a first insulating layer ILD1 may be disposed on the device isolation layer STI.

The gate lines GL2 and GL3 may be disposed on the device isolation layer STI. The gate lines GL2 and GL3 may include, for example, a metal material, such tungsten (W) and/or titanium (Ta), a nitride thereof, a silicide thereof, or a doped polysilicon, and may be formed, for example, by using a deposition process such as a plasma enhanced chemical vapor deposition (PECVD) process. The gate lines GL2 and GL3 may correspond to the second gate line GL2 and the third gate line GL3 of FIG. 3, respectively.

The gate contact CB4 is disposed on the gate line GL3. The gate contact CB4 may include, for example, a material having electrical conductivity, such as tungsten and/or doped polysilicon. A via V0_1 is formed at a second insulating layer ILD2 on the gate contact CB4 to electrically connect the gate contact CB5 and the metal line M1_4. The via V0_1 may be formed to include a material having electrical conductivity. The metal line M1_4 may be disposed on the via V0_1 and may be electrically connected with the via V0_1. The metal line M1_4 may be a metal layer including tungsten (W), aluminum (Al), copper (Cu), molybdenum (Mo), titanium (Ti), tantalum (Ta), ruthenium (Ru), or an alloy thereof, or a polysilicon layer. The metal line M1_4 and the via V0_1 may be formed with a damascene process such as a dual-damascene process; however, example embodiments are not limited thereto.

In the structured described above, the NMOS transistor NM12 is formed by/corresponds to the second gate line GL2. The NMOS transistor NM12 shares a gate electrode with the NMOS transistor NM24 to be described later. The NMOS transistor NM14 is formed by/corresponds to the third gate line GL3. The NMOS transistor NM14 shares a gate electrode with the NMOS transistor NM22 to be described later. Accordingly, a signal provided through the gate contact CB4 may be simultaneously provided to the NMOS transistor NM22.

As described above, only one gate contact CB4 may be used for the two NMOS transistors NM12 and NM24 included in the master latch 110 and the slave latch 120. Accordingly, there may a prevention of, or an improvement in, the reduction of performance of the flip-flop 100 due to a delay of a clock signal or timing mismatch caused by the formation of gate contacts.

FIG. 4B shows cross sections of the NMOS transistors NM22 and NM24 of the slave latch 120, taken along line II-II'. The substrate SUB, the device isolation layer STI, the insulation layers ILD1 and ILD2 may be substantially identical to those of FIG. 4A. Thus, additional description will be omitted to avoid redundancy.

The gate lines GL2 and GL3 may be disposed on the device isolation layer STI. The gate lines GL2 and GL3 correspond to the same gate lines as the gate lines GL2 and GL3 of FIG. 4A, respectively. The gate contact CB9 is disposed on the gate line GL2. The gate contact CB9 may include, for example, a material having electrical conductivity, such as tungsten, and may be formed of the same material of the gate contact CB4 discussed above with respect to FIG. 4A. A via V0_2 is disposed on the gate contact CB9 to electrically connect the gate contact CB9 and the metal line M1_6. The via V0_2 may be formed to include a material having electrical conductivity, and may be formed of the same material of the via V0_1 discussed above with respect to FIG. 4A. The metal line M1_6 may be disposed on the via V0_2 and may be electrically connected with the via V0_2. The clock signal "N" may be provided to the gate electrode GL2 of the NMOS transistor NM24 through the metal line M1_6, the via V0_2, and the gate contact CB9.

In the structures illustrated in FIGS. 4A and 4B, the NMOS transistors NM12 and NM24 are formed by the second gate line GL2. The clock signal "N" may be simultaneously provided to the NMOS transistors NM12 and NM24 through the metal line M1_6, the via V0_2, and the gate contact CB9. The NMOS transistors NM14 and NM22 are formed by the third gate line GL3. The clock signal "B" may be simultaneously provided to the NMOS transistors NM14 and NM22 through the metal line M1_4, the via V0_1, and the gate contact CB4.

According to the layout structure described above, only one gate contact CB9 may be formed for the NMOS transistors NM12 and NM24 for the purpose of providing the clock signal "N". Only one gate contact CB4 may be formed for the NMOS transistors NM14 and NM22 for the purpose of providing the clock signal "B". Accordingly, the reduction of speed or reliability of a flip-flop caused depending on the number of gate contacts or locations thereof may be markedly prevented or the amount of reduction may be reduced.

FIGS. 5 to 10 are views illustrating a standard cell layout structure of a flip-flop according to some example embodiments of inventive concepts. In FIGS. 5 to 10, the gate contacts CB1, CB5, and CB6 formed at the gate lines GL1 and GL4 are substantially identical to those of FIG. 3, and thus, the illustration of the gate contacts CB1, CB5, and CB6 is omitted. In addition, the illustration of vias formed on the gate contacts CB2, CB3, CB4, CB7, CB8, and CB9, the active areas ACT1 to ACT4, and the power rails MPL1 to MPL3 is omitted in FIGS. 5 to 10.

In addition, the gate line GL1 may be divided into two portions GL11 and GL12 by the cutting layer CT31. The gate line GL2 may be divided into three portions GL21, GL22, and GL23 by the cutting layers CT2 and CT4. The gate line GL3 is divided into three portions GL31, GL32, and GL33 by the cutting layers CT2 and CT4. The gate line GL4 is divided into two portions GL41 and GL42 by the cutting layer CT32.

Figure 5:
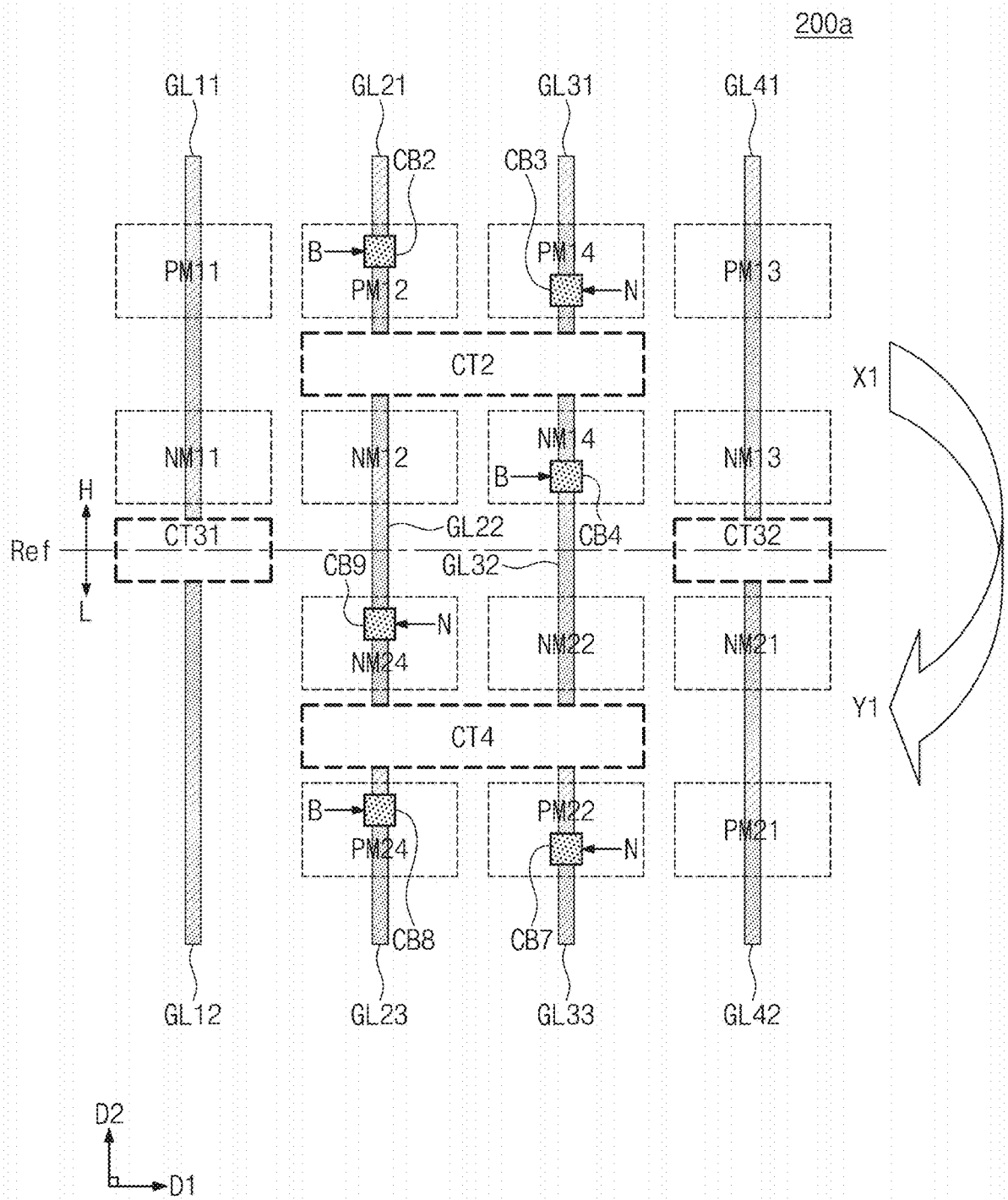
FIGS. 5 to 10 are views illustrating a standard cell layout structure of a flip-flop according to another embodiment of inventive concepts.

In a standard cell layout structure 200a of a flip-flop according to some example embodiments illustrated in FIG. 5, the gate contact CB9 may be disposed at an intersection of the gate line GL22 and the third active area ACT3, and the gate contact CB4 may be disposed at an intersection of the gate line GL32 and the second active area ACT2.

The gate line GL1 is divided into gate lines GL11 and GL12 electrically separated by the cutting layer CT31. The transistors PM11 and NM11 included in the master latch 110 of FIG. 3 may be formed by the gate line GL11.

The gate line GL4 may be divided into gate lines GL41 and GL42 electrically separated by the cutting layer CT32. The transistors PM13 and NM13 included in the master latch 110 may be formed by the gate line GL41. The transistors PM21 and NM21 included in the slave latch 120 may be formed by the gate line GL42.

The gate line GL2 may be divided into three gate lines GL21, GL22, and GL23 electrically separated by the 2CPP cutting layers CT2 and CT4. The gate line GL21 forms/corresponds to the PMOS transistor PM12 of the master latch 110, and the gate line GL23 forms/corresponds to the PMOS transistor PM24 of the slave latch 120. However, the gate line GL22 placed between the 2CPP cutting layers CT2 and CT4 may form/correspond to the NMOS transistors NM12 and NM24 sharing one gate contact CB9. Here, the gate contact CB9 may be formed/correspond to at any location on the gate line GL22. For example, the gate contact CB9 may be formed at a location where the NMOS transistors NM12 and NM24 are able to operate at an improved, e.g. an optimum speed. For example, the double height structure DHS may be divided into an upper portion "H" and a lower portion "L" by a reference line Ref, and the gate contact CB9 may be formed at the lower portion "L" of the double height structure DHS. Alternatively, the gate contact CB9 may be formed at an intersection of the gate line GL22 and the third active area ACT3.

The gate line GL3 may be divided into three gate lines GL31, GL32, and GL33 electrically separated by the 2CPP cutting layers CT2 and CT4. The gate line GL31 forms/corresponds to the PMOS transistor PM14 of the master latch 110, and the gate line GL33 forms/corresponds to the PMOS transistor PM22 of the slave latch 120. However, the gate line GL32 placed between the 2CPP cutting layers CT2 and CT4 may form/correspond to the NMOS transistors NM14 and NM22 sharing one gate contact CB4. Here, the gate contact CB4 may be formed at any location on the gate line GL32. Desirably, the gate contact CB4 may be formed at a location where the NMOS transistors NM14 and NM22 are able to operate at an improved/optimum speed.

For example, the gate contact CB4 may be formed at the upper portion "H" of the double height structure DHS. Alternatively, the gate contact CB4 may be formed at an intersection of the gate line GL32 and the second active area ACT2.

Figure 6:
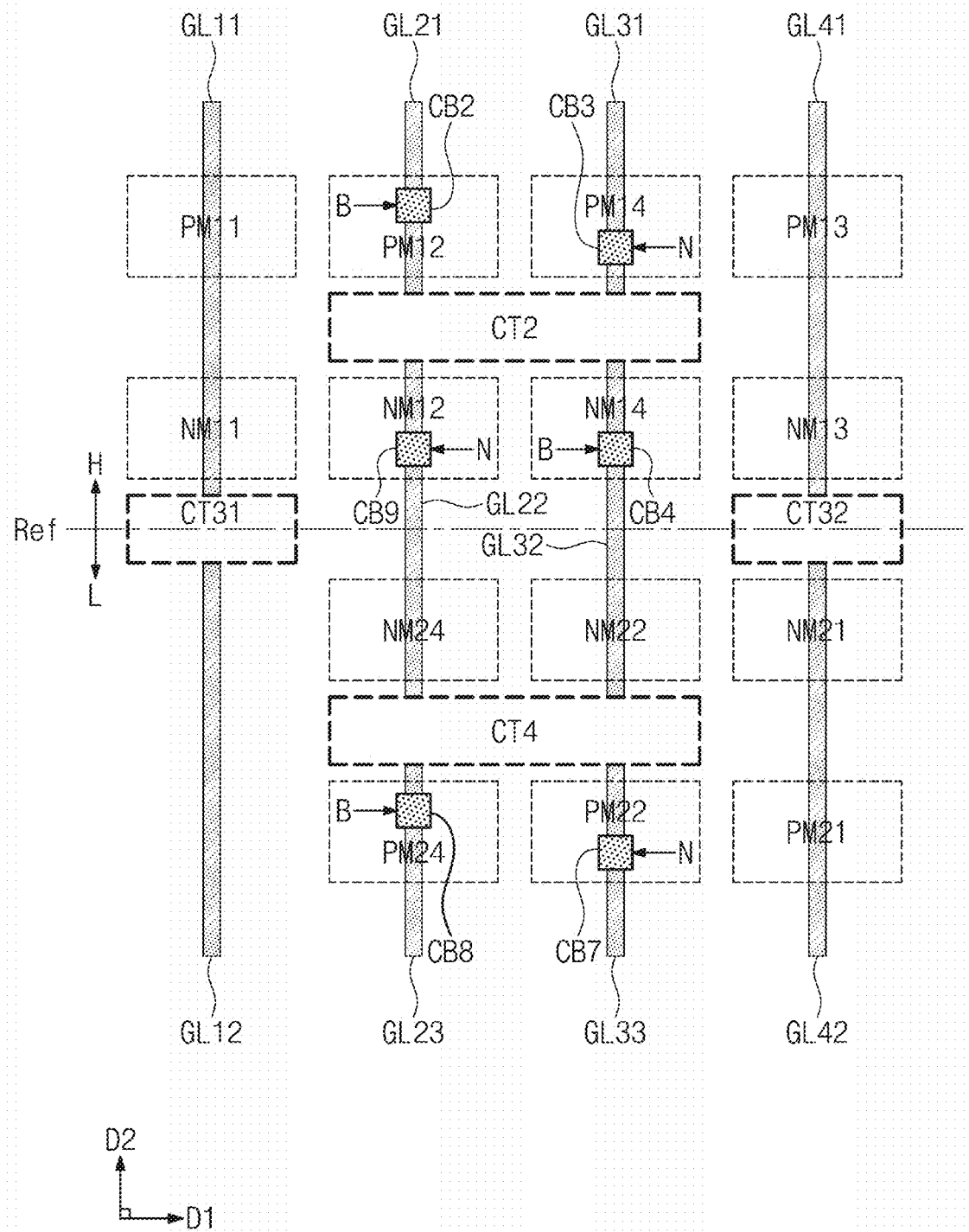

In a standard cell layout structure 200b of a flip-flop according to some example embodiments illustrated in FIG. 6, the gate contacts CB4 and CB9 may be placed at the upper portion "H" of the double height structure DHS above the reference line Ref. Here, locations or shapes of the gate contacts CB2, CB3, CB7, and CB8 are not described in detail. For example, the number of gate contacts CB4 and CB9 may allow the master latch 110 and the slave latch 120 to share the clock signals "N" and "B" and location thereof.

The gate contact CB9 for transferring the clock signal "N" to the gate line GL22 placed between the 2CPP cutting layers CT2 and CT4 may be placed at the upper portion "H" of the double height structure DHS with respect to the reference line Ref. Alternatively, the gate contact CB9 may be formed at an intersection of the gate line GL22 and the second active area ACT2. The gate contact CB4 for transferring the clock signal "B" to the gate line GL32 placed between the 2CPP cutting layers CT2 and CT4 may be placed at the upper portion "H" of the double height structure DHS with respect to the reference line Ref. Alternatively, the gate contact CB4 may be formed at an intersection of the gate line GL32 and the second active area ACT2.

Figure 7:
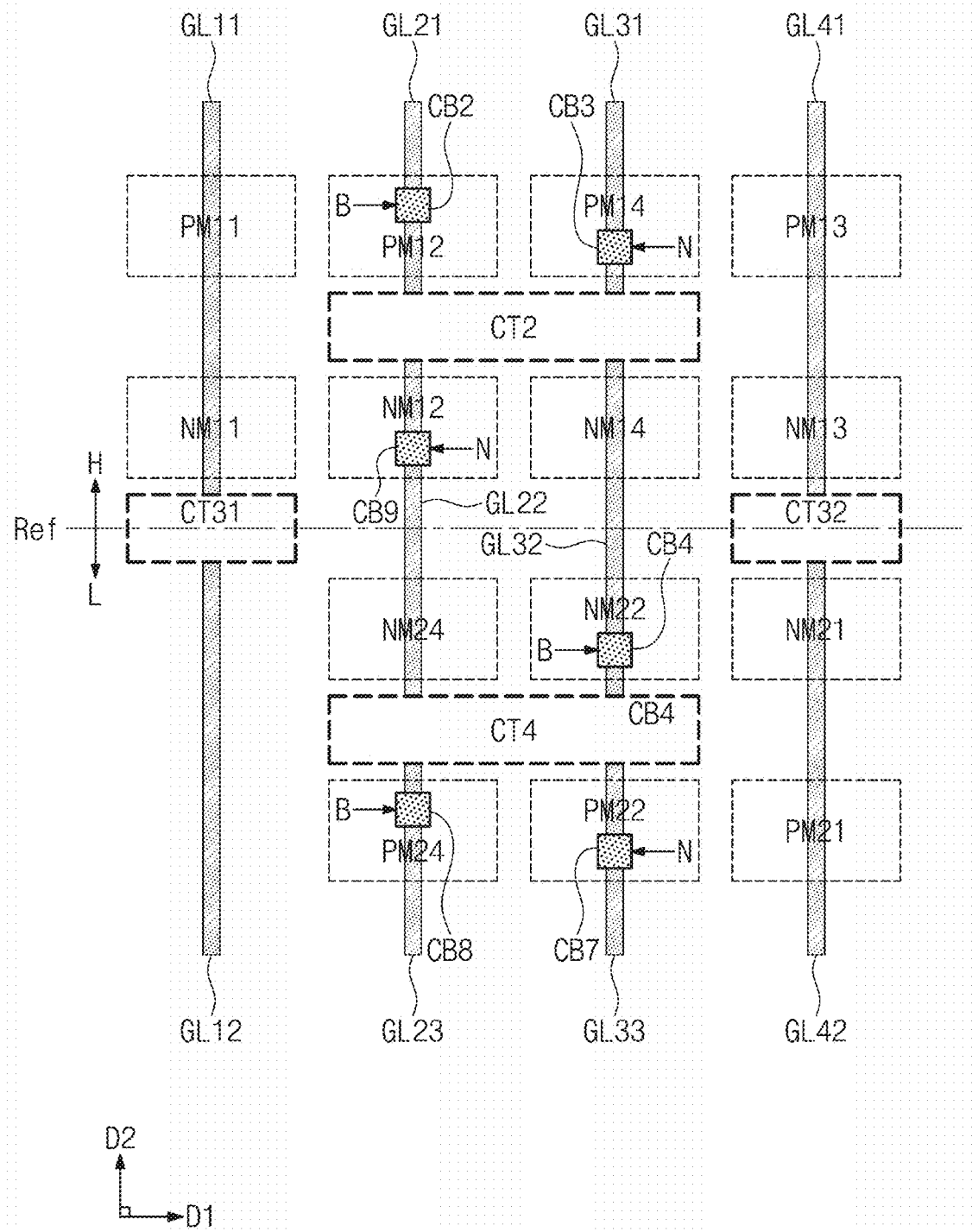

In a standard cell layout structure 200c of a flip-flop according to some example embodiments illustrated in FIG. 7, the gate contact CB4 may be placed at the lower portion "L" of the double height structure DHS, and the gate contact CB9 may be placed at the upper portion "H" of the double height structure DHS.

The gate contact CB9 for transferring the clock signal "N" to the gate line GL22 placed between the 2CPP cutting layers CT2 and CT4 may be placed at the upper portion "H" of the double height structure DHS with respect to the reference line Ref. Alternatively, the gate contact CB9 may be formed at an intersection of the gate line GL22 and the second active area ACT2. The gate contact CB4 for transferring the clock signal "B" to the gate line GL32 placed between the 2CPP cutting layers CT2 and CT4 may be placed at the lower portion "L" of the double height structure DHS with respect to the reference line Ref. Alternatively, the gate contact CB4 may be formed at an intersection of the gate line GL32 and the third active area ACT3.

Figure 8:
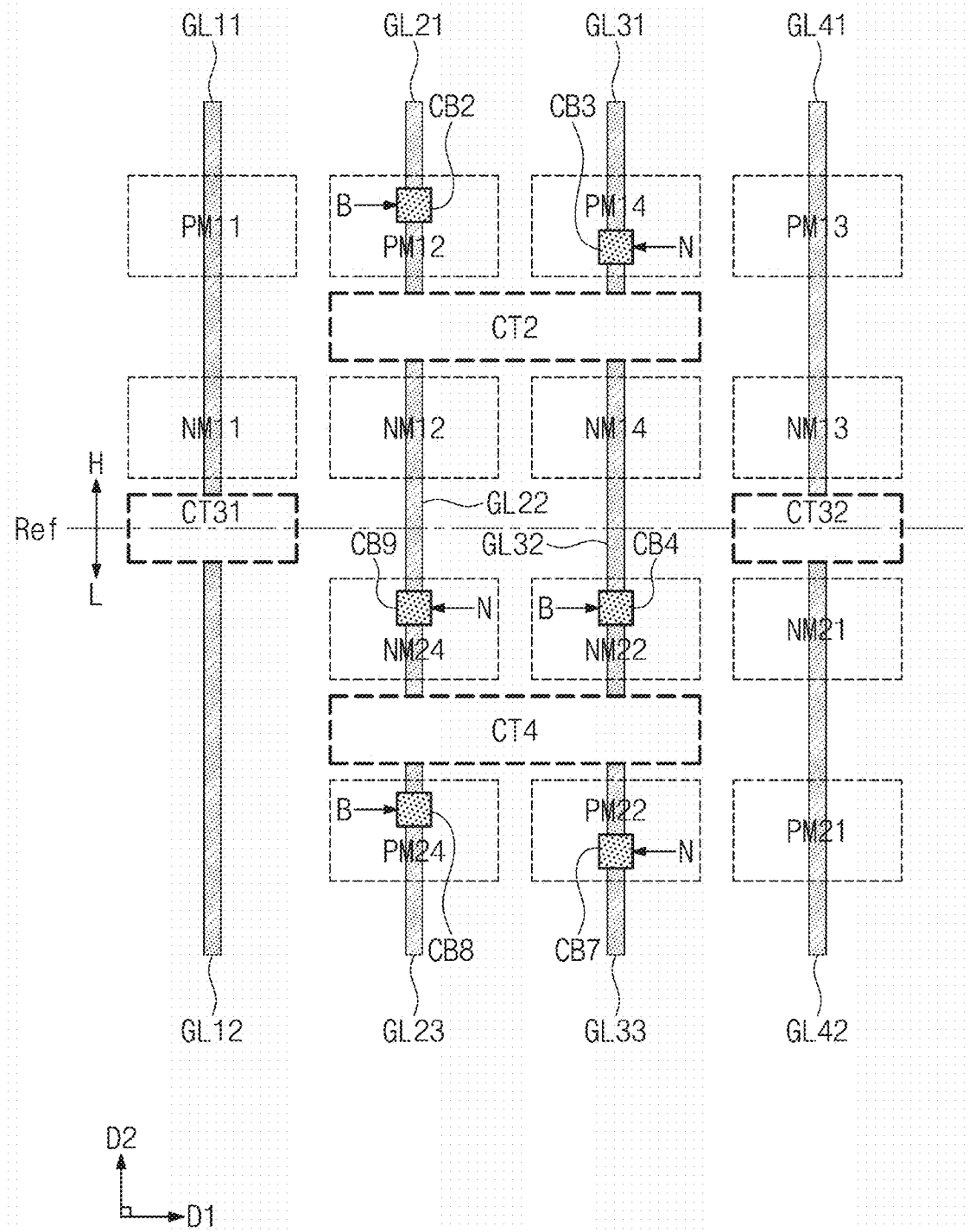

In a standard cell layout structure 200d of a flip-flop according some example embodiments illustrated in FIG. 8, all the gate contacts CB4 and CB9 may be placed at the lower portion "L" of the double height structure DHS.

The gate contact CB9 for transferring the clock signal "N" to the gate line GL22 placed between the 2CPP cutting layers CT2 and CT4 may be placed at the lower portion "L" of the double height structure DHS with respect to the reference line Ref. Alternatively, the gate contact CB9 may be formed at an intersection of the gate line GL22 and the third active area ACT3. The gate contact CB4 for transferring the clock signal "B" to the gate line GL32 placed between the 2CPP cutting layers CT2 and CT4 may be placed at the lower portion "L" of the double height structure DHS with respect to the reference line Ref. Alternatively, the gate contact CB4 may be formed at an intersection of the gate line GL32 and the third active area ACT3.

Figure 9:
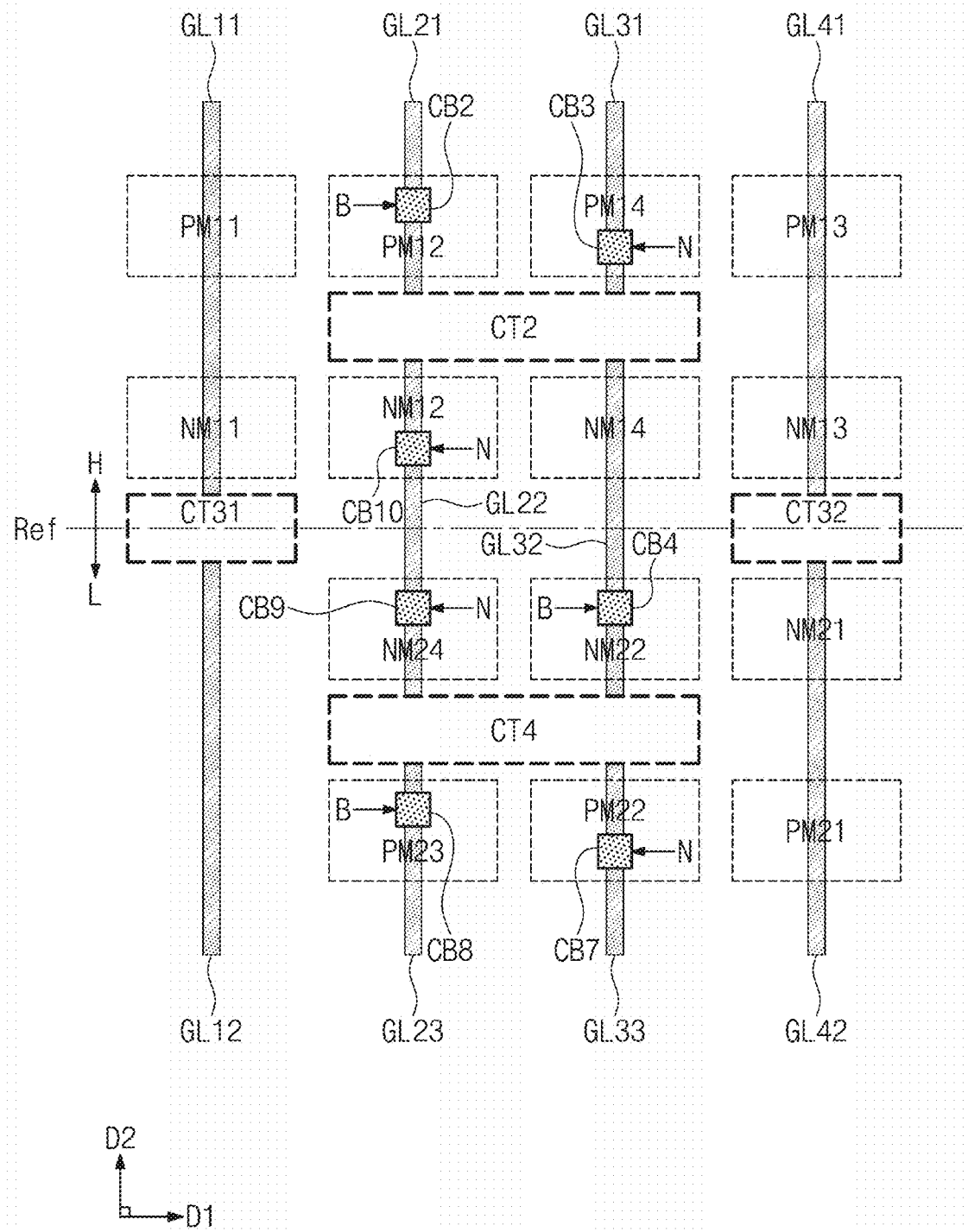

In a standard cell layout structure 200e of a flip-flop according to some example embodiments illustrated in FIG. 9, two gate contacts CB9 and CB10 may be formed on the gate line GL22 placed between the 2CPP cutting layers CT2 and CT4. One gate contact CB4 may be formed on the gate line GL32 placed between the 2CPP cutting layers CT2 and CT4.

The gate contacts CB9 and CB10 for transferring the clock signal "N" to the gate line GL22 placed between the 2CPP cutting layers CT2 and CT4 may be respectively placed at the lower portion "L" and the upper portion "H" of the double height structure DHS with respect to the reference line Ref. Alternatively, the gate contact CB9 may be formed at an intersection of the gate line GL22 and the second active area ACT2, and the gate contact CB10 may be disposed at an intersection of the gate line GL22 and the third active area ACT3. The gate contact CB4 for transferring the clock signal "B" to the gate line GL32 placed between the 2CPP cutting layers CT2 and CT4 may be placed at the lower portion "L" of the double height structure DHS with respect to the reference line Ref. Alternatively, it may be well understood that the gate contact CB4 is placed at the upper portion "H" of the double height structure DHS with respect to the reference line Ref.

Figure 10:
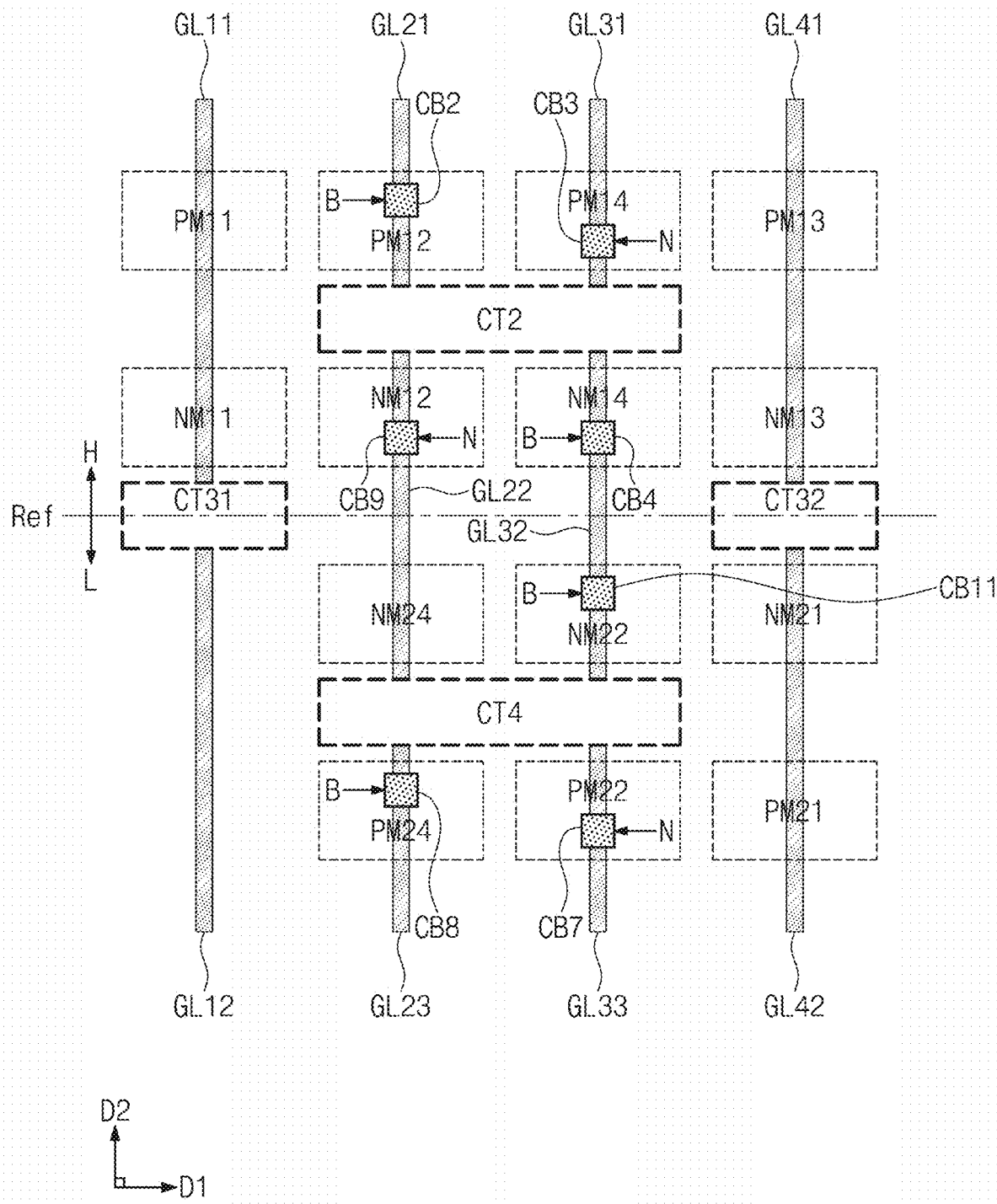

In a standard cell layout structure 200f of a flip-flop according to some example embodiments illustrated in FIG. 10, one gate contact CB9 may be formed on the gate line GL22 placed between the 2CPP cutting layers CT2 and CT4. In contrast, two gate contacts CB4 and CB11 may be formed on the gate line GL32 placed between the 2CPP cutting layers CT2 and CT4.

The gate contact CB9 for transferring the clock signal "N" to the gate line GL22 placed between the 2CPP cutting layers CT2 and CT4 may be placed at the lower portion "L" or the upper portion "H" of the double height structure DHS with respect to the reference line Ref. Alternatively, the gate contact CB9 may be formed at an intersection of the gate line GL22 and the second or third active area ACT2 or ACT3.

The gate contacts CB4 and CB11 for transferring the clock signal "B" to the gate line GL32 placed between the 2CPP cutting layers CT2 and CT4 may be respectively placed at the upper portion "H" and the lower portion "L" of the double height structure DHS with respect to the reference line Ref. Alternatively, the gate contact CB4 may be formed at an intersection of the gate line GL32 and the second active area ACT2, and the gate contact CB11 may be disposed at an intersection of the gate line GL32 and the third active area ACT3.

Figure 11A:
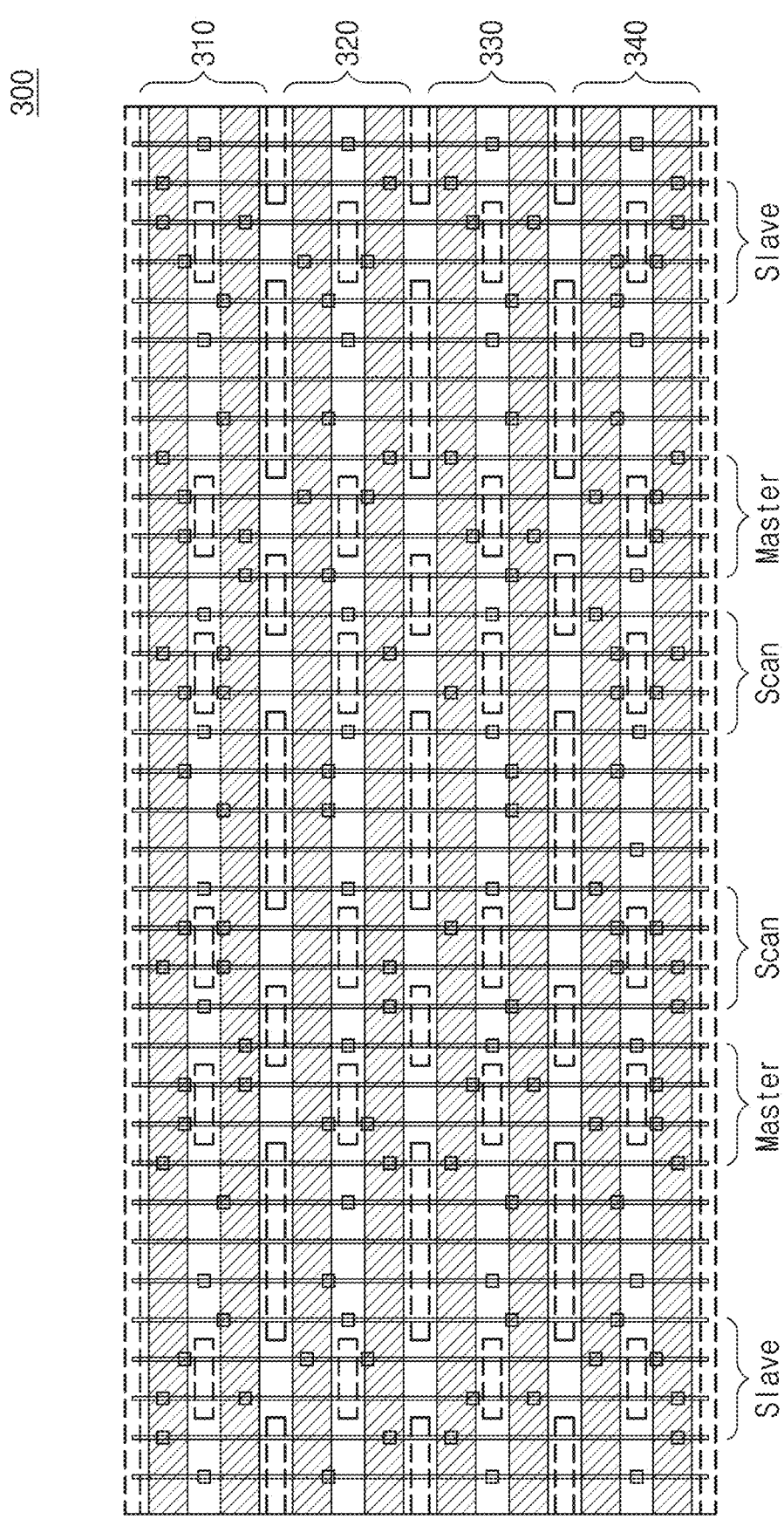
FIGS. 11A and 11B are views illustrating a layout structure of a flip-flop according to another embodiment of inventive concepts.
Figure 11B:
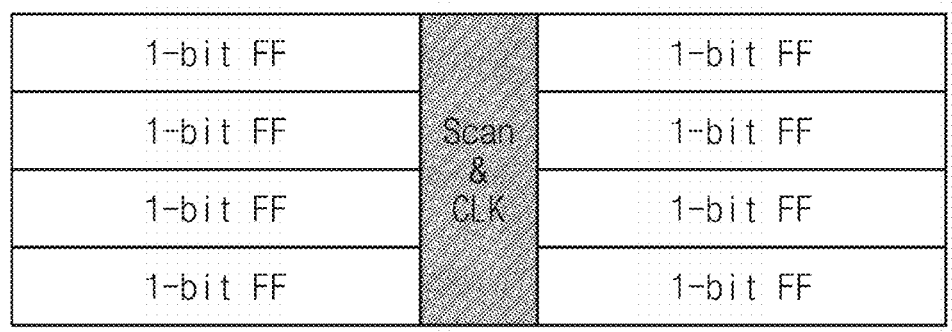

FIGS. 11A and 11B are views illustrating a layout structure of a flip-flop according to another embodiment of inventive concepts.

FIG. 11A schematically shows gate lines and gate contacts for forming eight (8) flip-flops and scan and clock circuits and shapes of cutting layers. A layout 300 illustrated in FIG. 11A provides a structure in which a plurality of flip-flops are formed by repeatedly arranging the layout illustrated in FIG. 3.

Referring to FIG. 11B, a scan and clock circuit Scan & CLK may be formed on/in the center of the layer 300, and four flip-flops may be formed on the left of the scan and clock circuit Scan & CLK. Additionally, four flip-flops may be formed on the right of the scan and clock circuit Scan & CLK. Each of, or at least some of, the flip-flops may be implemented in the layout structure described with reference to FIG. 3. For example, two NMOS transistors may be formed at one gate line placed between 2CPP cutting layers, but one gate contact CB for transferring a clock signal nclk or bclk may be provided.

Figure 12:
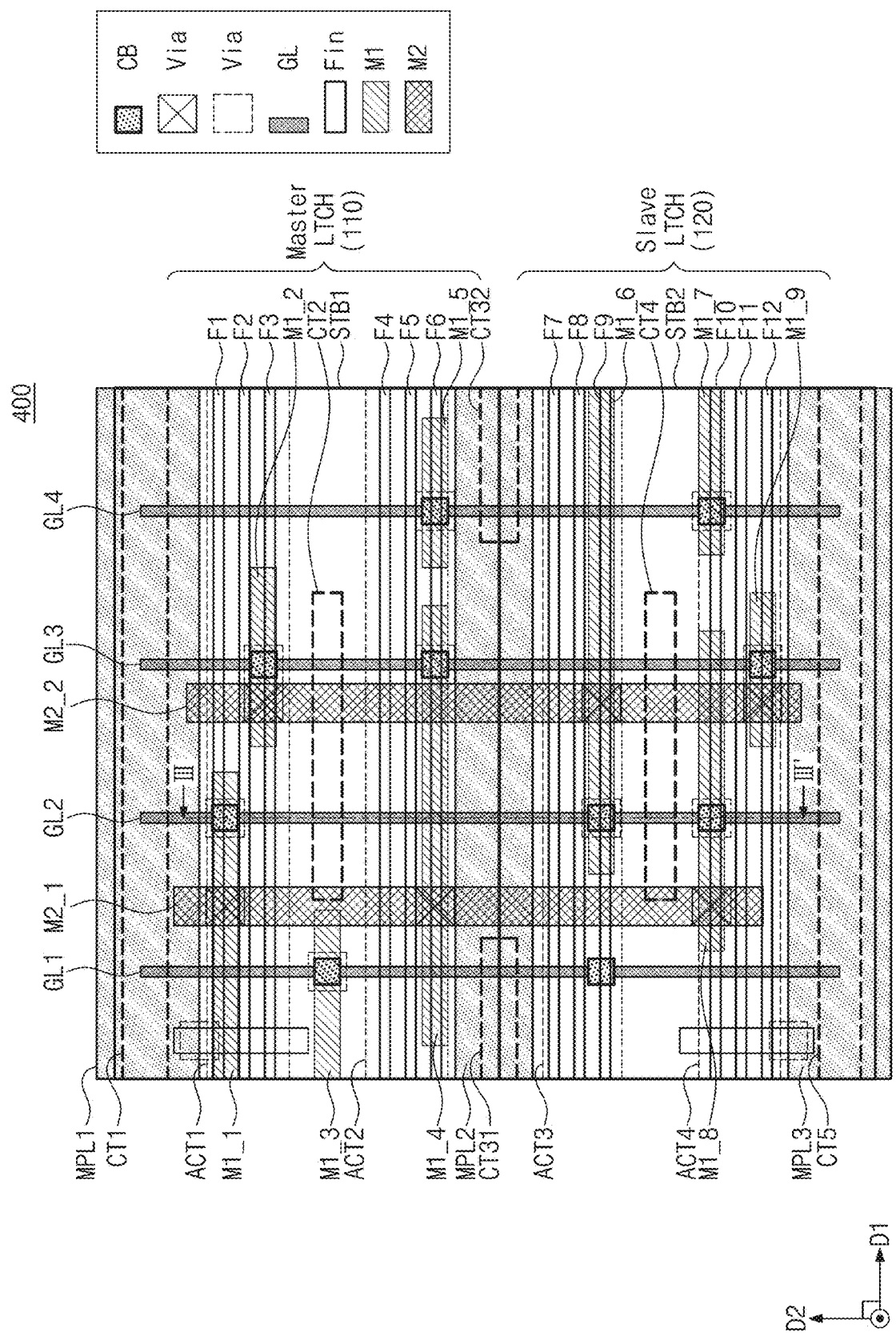
FIG. 12 is a view illustrating a standard cell layout structure of a flip-flop according to another embodiment of inventive concepts.

FIG. 12 is a view illustrating a standard cell layout structure of a flip-flop according to some example embodiments of inventive concepts. Referring to FIG. 12, a standard cell 400 of inventive concepts may be implemented by a layout that uses the double height structure DHS and the 2CPP cutting layers CT and includes a FinFET.

The standard cell 400 may include the first to fourth active areas ACT1, ACT2, ACT3, and ACT4, the first to fourth gate lines GL1 to GL4, the plurality of gate contacts CB1 to CB9, the cutting layers CT1, CT2, CT31, CT32, CT4, and CT5, and the power rails MPL1, MPL2, and MPL3. The standard cell 400 according to the present embodiment has a cross couple structure for providing the clock signals "N" and "B". Here, for convenience of description of inventive concepts, only a portion of the standard cell 400 is illustrated, but the standard cell 400 may be designed to further include any other components (or elements).

The first to fourth active areas ACT1 to ACT4 may extend along the first direction D1 and may be disposed parallel to each other in the second direction D2 substantially perpendicular to the first direction D1. In some example embodiments, the first active area ACT1 and the second active area ACT2 may be disposed to be spaced from each other in the second direction D2. The power rail MPL2 for providing the ground voltage VSS may be placed between the second active area ACT2 and the third active area ACT3. In addition, the third active area ACT3 and the fourth active area ACT4 may be disposed to be spaced from each other in the second direction D2.

A plurality of fin patterns F1 to F12 may be disposed above the first to fourth active areas ACT1 to ACT4. Each of the plurality of fin patterns F1 to F12 may extend along the first direction D1 over the first to fourth active areas ACT1 to ACT4. Three fin patterns F1 to F3 may be formed above the first active area ACT1. Three fin patterns F4 to F6 may be formed above the second active area ACT2. Three fin patterns F7 to F9 may be formed above the third active area ACT3. Three fin patterns F10 to F12 may be formed above the fourth active area ACT4. Some example embodiments may be illustrated as three fins are formed above one active area, but it may be understood that inventive concepts are not limited thereto.

The first to fourth gate lines GL1, GL2, GL3, and GL4 may extend along the second direction D2 over the first to fourth active areas ACT1 to ACT4 and may be disposed parallel to each other in the first direction D1. The first to fourth gate lines GL1, GL2, GL3, and GL4 may extend in a direction perpendicular to the plurality of fin patterns F1 to F12. As the first to fourth gate lines GL1, GL2, GL3, and GL4 are formed on the plurality of fin patterns F1 to F12, the FinFet may be formed.

The cutting layers CT1, CT2, CT31, CT32, CT4, and CT5 may be formed to cross at least one of the first to fourth gate lines GL1, GL2, GL3, and GL4. Structures and shapes of the cutting layers CT1, CT2, CT31, CT32, CT4, and CT5 are substantially identical to those of FIG. 3 described above, and thus, additional description will be omitted to avoid redundancy.

The plurality of gate contacts CB1 to CB9 are provided to transfer gate signals of transistors constituting/included in the flip-flop 100. Reference signs "CB1" to "CB9" of gate contacts are omitted, but locations and functions of the plurality of gate contacts CB1 to CB9 are substantially identical to those of FIG. 3 described above. Thus, additional description will be omitted to avoid redundancy.

As described above, according to the standard cell layout of the flip-flop 100 of inventive concepts, the number of gate contacts for NMOS transistors included in the master latch 110 and the slave latch 120 may decrease by using the dual height structure. Alternatively or additionally, because a location of a gate contact for an NMOS transistor is adjustable, the performance of the flip-flop may be prevented from, or reduced in likelihood of, being reduced due to the number of gate contacts or locations thereof.

Figure 13:
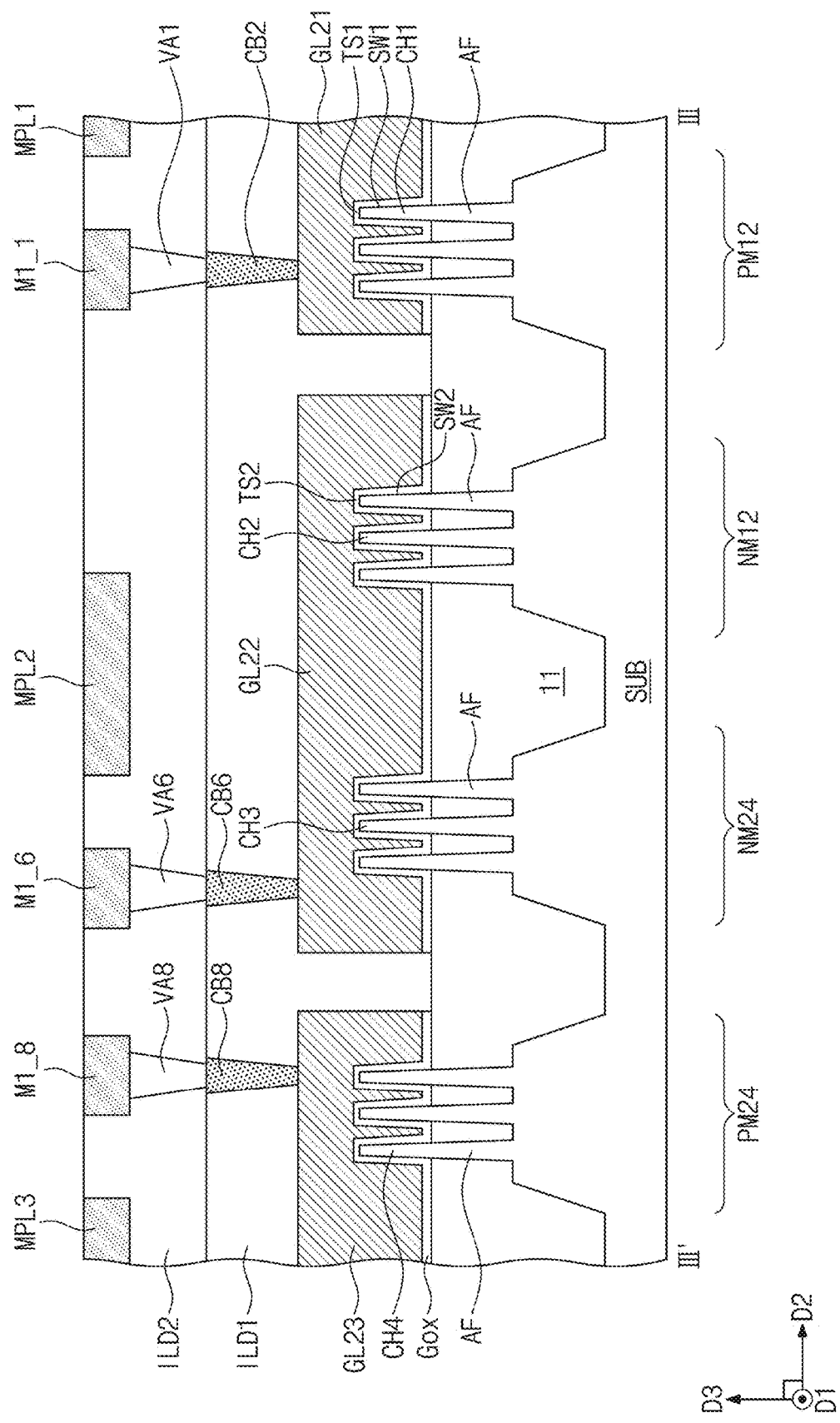
FIG. 13 is a cross-sectional view of a standard cell taken along line III-III' of FIG. 12, according to embodiments of inventive concepts.

FIG. 13 is a cross-sectional view of a standard cell taken along line III-III' of FIG. 12, according to some example embodiments of inventive concepts. A semiconductor device illustrated in FIG. 13 is a FinFET. The gate contacts CB2, CB6, and CB8 may be in contact with the gate lines GL21, GL22, and GL23 through the first interlayer insulating layer ILD1.

The clock signal "B" provided through the metal line M1_1 is transferred to the gate contact CB2 through a via VA1. The gate contact CB2 is formed to provide the clock signal "B" to the gate electrode of/corresponding to the PMOS transistor PM12 included in the master latch 110. The gate line GL2 is divided into three gate lines GL21, GL22, and GL23 electrically separated by the cutting layers CT2 and CT4. The first active area ACT1 and the gate line GL21 may form/correspond to the PMOS transistor PM12. The clock signal "B" is provided to the gate line GL21 for the gate electrode of the PMOS transistor PM12 through the gate contact CB2.

A plurality of active fins AF for forming the PMOS transistor PM12 may be provided. The active fins AF may be extended in the first direction D1 to be parallel to each other. As a portion of the substrate SUB, the active fins AF may be vertical protrusions. A device isolation layer 11 may include a silicon oxide layer. Upper portions of the active fins AF may vertically protrude above the device isolation layer 11. The device isolation layer 11 may not cover the upper portions of the active fins AF. The device isolation layer 11 may cover side walls of lower portions of the active fins AF. The gate lines GL21, GL22, and GL23 may intersect the active fins AF. A gate insulating layer Gox may be interposed between the gate lines GL21, GL22, and GL23 and the active fins AF.

Each of the active fins AF placed at the PMOS transistor PM12 may include a first top surface TS1 and first side walls SW1. The gate line GL21 covers the first top surfaces TS1 and the first side walls SW1. In the PMOS transistor PM12, first channel areas CH1 may be formed at upper portions of the active fins AF overlapping the gate line GL21. In the PMOS transistor PM12, source/drain patterns may be disposed on the active fins AF on opposite sides of the gate line GL21. The source/drain patterns may include a semiconductor element (e.g., SiGe) having a lattice constant greater than a lattice constant of a semiconductor element of the substrate SUB. As such, the source/drain patterns may provide a compressive stress to the first channel areas CH1. P-type impurity (e.g., boron) may be introduced in the source/drain patterns.

The clock signal "N" provided through the metal line M1_6 is transferred to the gate contact CB6 through a via VA6. The gate contact CB6 is formed to provide the clock signal "N" to the gate electrodes of/corresponding to the NMOS transistors NM12 and NM24. The gate line GL22 separated by the cutting layers CT2 and CT4 and the second and third active areas ACT2 and ACT3 may form the NMOS transistors NM12 and NM24.

Each of the active fins AF placed at the NMOS transistor NM12 may include a second top surface TS2 and second side walls SW2. The gate line GL22 covers the second top surfaces TS2 and the second side walls SW2. In the NMOS transistor NM12, second channel areas CH2 may be disposed at upper portions of the active fins AF each overlapping the gate line GL22. In the NMOS transistor NM12, source/drain patterns may be disposed on the active fins AF on opposite sides of the gate line GL22. The source/drain patterns may be or include a semiconductor epitaxial pattern. For example, the source/drain patterns may include a semiconductor element (e.g., Si) identical to/homogenous with that of the substrate SUB. N-type impurity (e.g., phosphorus and/or arsenic) may be introduced in the source/drain patterns. The NMOS transistor NM24 may be formed to be identical in shape to the NMOS transistor NM12 except that the NMOS transistor NM24 is formed above the third active area ACT3.

The clock signal "B" provided through the metal line M1_8 is transferred to the gate contact CB8 through a via VA8. The gate contact CB8 is formed to provide the clock signal "B" to the gate electrode of the PMOS transistor PM24 included in the slave latch 120. The gate line GL23 is electrically separated from the gate line GL22 by the cutting layer CT4. The fourth active area ACT4 and the gate line GL23 may form the PMOS transistor PM24. The clock signal "B" is provided to the gate line GL23 for the gate electrode of the PMOS transistor PM24 through the gate contact CB8.

A plurality of active fins AF for forming the PMOS transistor PM24 may be provided. The active fins AF may be extended in the first direction D1 to be parallel to each other. As a portion of the substrate SUB, the active fins AF may be vertical protrusions. The device isolation layer 11 may include a silicon oxide layer. Upper portions of the active fins AF may vertically protrude above the device isolation layer 11. The device isolation layer 11 may not cover the upper portions of the active fins AF. The device isolation layer 11 may cover side walls of lower portions of the active fins AF. The gate line GL23 may intersect the active fins AF. The gate insulating layer Gox may be interposed between the gate line GL23 and the active fins AF.

Figure 14:
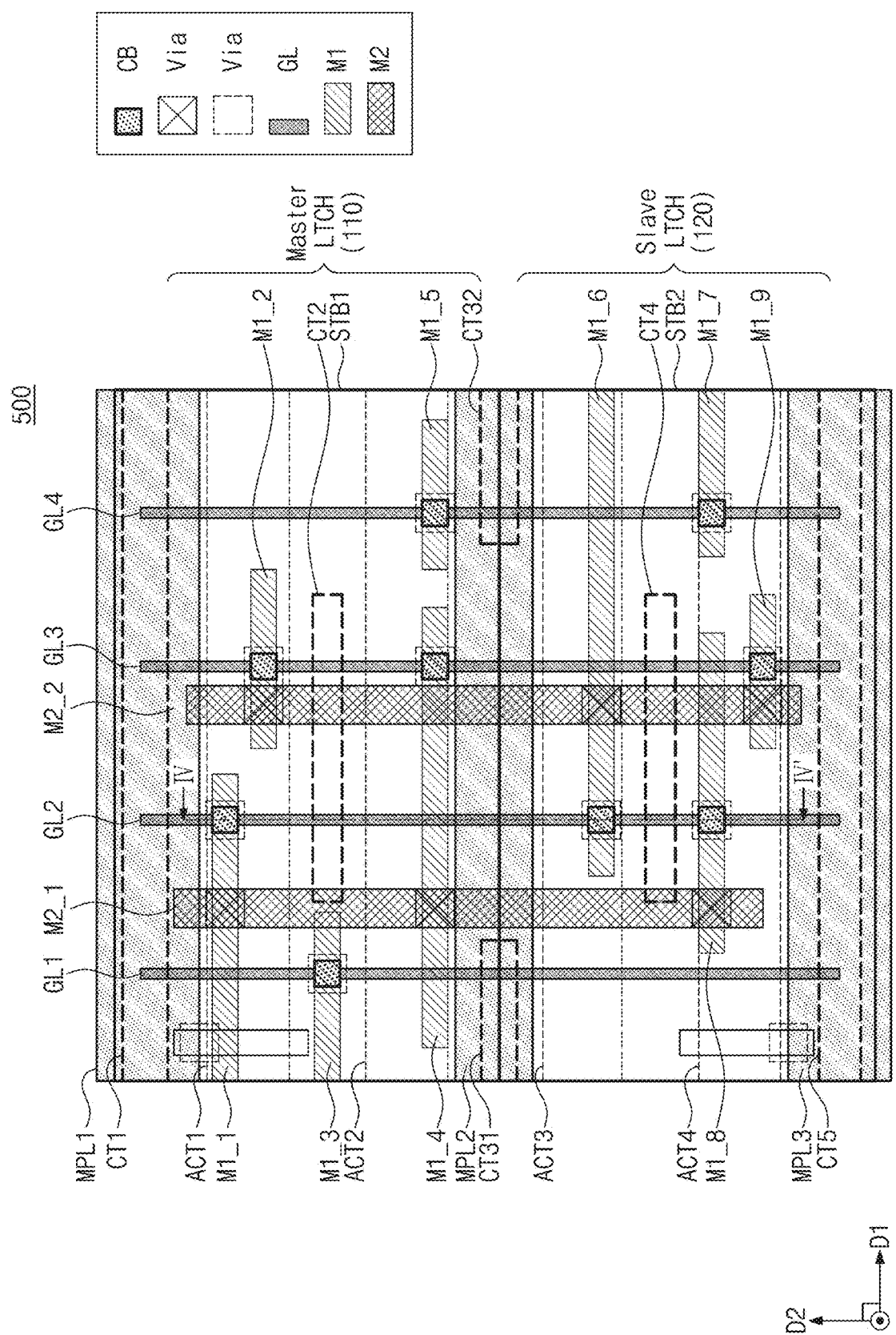
FIG. 14 is a view illustrating a standard cell layout structure of a flip-flop according to another embodiment of inventive concepts.

FIG. 14 is a view illustrating a standard cell layout structure of a flip-flop according to another embodiment of inventive concepts. Referring to FIG. 14, a standard cell 500 of inventive concepts may be implemented by a layout that uses the double height structure DHS and the 2CPP cutting layers CT. Also, the standard cell 500 may be implemented by a layout including a multi-bridge channel FET (MBCFET) and/or a gate-all-around FET (GAAFET).

The standard cell 500 may include the first to fourth active areas ACT1, ACT2, ACT3, and ACT4, the first to fourth gate lines GL1 to GL4, the plurality of gate contacts CB1 to CB9, the cutting layers CT1, CT2, CT31, CT32, CT4, and CT5, and the power rails MPL1, MPL2, and MPL3. The standard cell 500 according to the present embodiment has a cross couple structure for providing the clock signals "N" and "B".

The first to fourth active areas ACT1 to ACT4 may be extended along the first direction D1 and may be disposed parallel to each other in the second direction D2 substantially perpendicular to the first direction D1. In the present embodiment, the first active area ACT1 and the second active area ACT2 may be disposed to be spaced from each other in the second direction D2. The power rail MPL2 for providing the ground voltage VSS may be placed between the second active area ACT2 and the third active area ACT3. In addition, the third active area ACT3 and the fourth active area ACT4 may be disposed to be spaced from each other in the second direction D2.

Nanosheets and/or nanowires for MBCFET and/or GAAFET channels may be formed above the first to fourth active areas ACT1, ACT2, ACT3, and ACT4. The nanosheets and/or nanowires may be extended along the first direction D1 over the first to fourth active areas ACT1 to ACT4.

The first to fourth gate lines GL1, GL2, GL3, and GL4 may be extended along the second direction D2 over the first to fourth active areas ACT1 to ACT4 and may be disposed parallel to each other in the first direction D1. The first to fourth gate lines GL1, GL2, GL3, and GL4 may be extended in a direction perpendicular to the nanosheets or nanowires. As the first to fourth gate lines GL1, GL2, GL3, and GL4 are formed to surround the nanosheets or nanowires, a multi-bridge channel FET (MBCFET) or a gate-all-around FET (GAAFET) may be formed.

The cutting layers CT1, CT2, CT31, CT32, CT4, and CT5 may be formed to cross at least one of the first to fourth gate lines GL1, GL2, GL3, and GL4. Structures and shapes of the cutting layers CT1, CT2, CT31, CT32, CT4, and CT5 are substantially identical to those of FIG. 3 described above, and thus, additional description will be omitted to avoid redundancy.

The plurality of gate contacts CB1 to CB9 are provided to transfer gate signals of transistors constituting the flip-flop 100. Reference signs "CB1" to "CB9" of gate contacts are omitted, but locations and functions of the plurality of gate contacts CB1 to CB9 are substantially identical to those of FIG. 3 described above. Thus, additional description will be omitted to avoid redundancy.

As described above, according to the standard cell layout of the flip-flop 100 of inventive concepts, the number of gate contacts for NMOS transistors included in the master latch 110 and the slave latch 120 may decrease by using the dual height structure. In addition, because a location of a gate contact for an NMOS transistor is adjustable, the performance of the flip-flop 100 may be prevented from, or reduced in likelihood of, being reduced due to the number of gate contacts or locations thereof.

Figure 15:
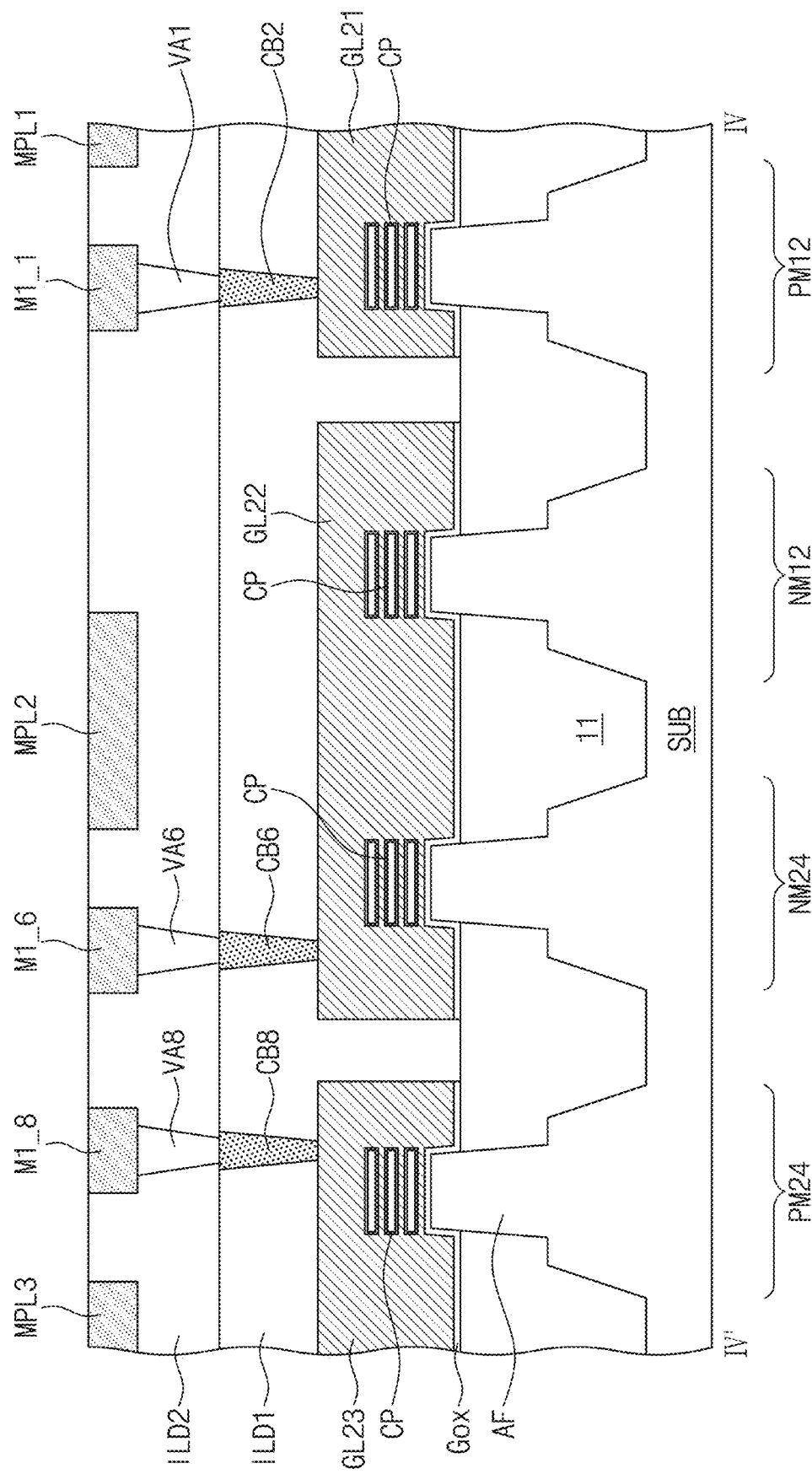
FIG. 15 is a cross-sectional view of a standard cell taken along line IV-IV' of FIG. 14, according to embodiments of inventive concepts.

FIG. 15 is a cross-sectional view of a standard cell taken along line IV-IV' of FIG. 14, according to embodiments of inventive concepts. Semiconductor devices illustrated in FIG. 15 may be a multi-bridge channel FET (MBCFET) or a gate-all-around FET (GAAFET). The gate contacts CB2, CB6, and CB8 may be in contact with the gate lines GL21, GL22, and GL23 through the first interlayer insulating layer ILD1. Here, shapes or structures of metal lines or gate lines are substantially identical to those of FIG. 13 except for a shape of a channel pattern.

In the standard cell 500 according to the present embodiment, each of the PMOS transistors PM12 and PM24 and the NMOS transistors NM12 and NM24 may include one active fin AF. In the PMOS transistor PM12, a plurality of channel patterns CP may be stacked on the active fin AF. The channel patterns CP may be spaced from each other. In the NMOS transistor NM12, channel patterns CP may be stacked on the active fin AF in a multi-layer structure. The gate line GL21 is formed to surround the channel patterns CP associated with the PMOS transistor PM12. The gate line GL22 is formed to surround the channel patterns CP associated with the NMOS transistors NM12 and NM24. The gate line GL23 is formed to surround the channel patterns CP associated with the PMOS transistor PM24. The remaining structure may be identical or similar to that described with reference to FIG. 13.

A transistor element of a flip-flop of inventive concepts is exemplified above, but the transistor element of inventive concepts is not limited thereto. For example, a transistor of a flip-flop may be at least one of a FinFET, an MBCFET (Multi-Bridge-Channel FET), a GAAFET (Gate-All-Around FET), and a VFET (Vertical FET).

According to an embodiment of inventive concepts, a speed of a transistor may be improved through a structure in which gate lines of a standard cell share a contact.

While inventive concepts have been described with reference to some example embodiments thereof, it will be apparent to those of ordinary skill in the art that various changes and modifications may be made thereto without departing from the spirit and scope of inventive concepts as set forth in the following claims.

What is claimed is:

1. A semiconductor device comprising:
 a standard cell,
 wherein the standard cell includes,
 first to fourth active areas extending in a first direction,
 first to fourth gate lines over the first to fourth active areas and parallel to each other, the first to fourth gate lines extending in a second direction perpendicular to the first direction,
 a first cutting layer between the first active area and the second active area and cutting the second and third gate lines,
 a second cutting layer between the third active area and the fourth active area and cutting the second and third gate lines,
 a first gate contact on the second gate line, the first gate contact between the first cutting layer and the second cutting layer, and
 a second gate contact on the third gate line, the second gate contact between the first cutting layer and the second cutting layer.

2. The semiconductor device of claim 1, further comprising:
 a first power line on an upper side of the first active area above the first active area in the second direction and configured to provide a first power supply voltage, the first power line extending in the first direction;
 a second power line on a lower side of the fourth active area below the fourth active area in the second direction and configured to provide the first power supply voltage, the second power line extending in the first direction; and
 a third power line between the second active area and the third active area and configured to provide a second power supply voltage, the third power line extending in the first direction.

3. The semiconductor device of claim 2, wherein the first power supply voltage corresponds to a driving voltage (VDD), and the second power supply voltage corresponds to a ground voltage (VSS).

4. The semiconductor device of claim 1, wherein the standard cell corresponds to a flip-flop including a master latch and a slave latch, and
 wherein the first gate contact is configured to receive a first clock signal driving the flip-flop, and the second gate contact is configured to receive a second clock signal complementary to the first clock signal.

5. The semiconductor device of claim 4, wherein the second gate line and the second active area corresponds to a first NMOS transistor, the first NMOS transistor configured to provide the first clock signal to a first tri-state inverter included in a data path of the master latch.

6. The semiconductor device of claim 5, wherein the second gate line and the third active area correspond to a second NMOS transistor, the second NMOS transistor configured to provide the first clock signal to a second tri-state inverter included in a feedback path of the slave latch.

7. The semiconductor device of claim 4, wherein the third gate line and the second active area correspond to a third NMOS transistor, the third NMOS transistor configured to provide the second clock signal to a third tri-state inverter included in a feedback path of the master latch.

8. The semiconductor device of claim 7, wherein the third gate line and the third active area corresponds to a fourth NMOS transistor, the fourth NMOS transistor configured to provide the second clock signal to a fourth tri-state inverter included in a data path of the slave latch.

9. The semiconductor device of claim 1, wherein the first gate contact overlaps the third active area, and the second gate contact overlaps the second active area.

10. The semiconductor device of claim 9, further comprising:
 a third gate contact on the second gate line, the third gate contact between the first cutting layer and the second cutting layer.

11. The semiconductor device of claim 9, further comprising:
 a fourth gate contact on the third gate line, the fourth gate contact between the first cutting layer and the second cutting layer.

12. The semiconductor device of claim 1, wherein a pitch of the first cutting layer and the second cutting layer in the first direction is two contact poly pitches (2CPP).

13. A semiconductor device which includes a flip-flop including a master latch and a slave latch, the master latch and the slave latch in a double height structure, the semiconductor device comprising:
 first and second gate lines extended in a first direction and parallel to each other;
 a first cutting layer extending in a second direction perpendicular to the first direction, the first cutting layer cutting the first and second gate lines;
 a second cutting layer cutting the first and second gate lines on one side below the first cutting layer with respect to the first direction;
 a first gate contact on the first gate line, the first gate contact between the first cutting layer and the second cutting layer; and a second gate contact on the second gate line, the second gate contact between the first cutting layer and the second cutting layer, wherein gates of first and second NMOS transistors associated with a data path of the master latch and a feedback path of the slave latch correspond to the first gate line placed between the first cutting layer and the second cutting layer, and gates of third and fourth NMOS transistors associated with a feedback path of the master latch and a data path of the slave latch correspond to the second gate line placed between the first cutting layer and the second cutting layer.

14. The semiconductor device of claim 13, wherein the first gate contact is configured to receive a first clock signal for driving the flip-flop, and the second gate contact is configured to receive a second clock signal complementary to the first clock signal.

15. The semiconductor device of claim 13, further comprising:
a power rail configured to provide a ground voltage to the flip-flop, the power rail extending the first direction, the power rail between the first cutting layer and the second cutting layer.

16. The semiconductor device of claim 13, further comprising:
a third gate contact on the first gate line, the third gate contact between the first cutting layer and the second cutting layer.

17. The semiconductor device of claim 16, further comprising:
a fourth gate contact on the second gate line, the fourth gate contact between the first cutting layer and the second cutting layer.

18. The semiconductor device of claim 13, further comprising:
a third gate contact on the second gate line, the third gate contact between the first cutting layer and the second cutting layer.

19. The semiconductor device of claim 18, further comprising:
a fourth gate contact on the first gate line, the third gate contact between the first cutting layer and the second cutting layer.

20. The semiconductor device of claim 13, wherein the first to fourth NMOS transistors correspond to a FinFET.

* * * * *